US008759884B2

(12) United States Patent
Brand et al.

(10) Patent No.: US 8,759,884 B2
(45) Date of Patent: Jun. 24, 2014

(54) ELECTRONIC DEVICE AND METHOD OF MANUFACTURING THE SAME

(75) Inventors: Jeroen van den Brand, Goirle (NL); Andreas Heinrich Dietzel, Kempen (DE); Edward Willem Albert Young, Maastricht (NL); Herbert Lifka, Son en Breugel (NL); Erik Dekempeneer, Malle (BE)

(73) Assignees: Nederlandse Organisatie voor toegepast—natuurwetenschappelijk onderzoek TNO, Delft (NL); Koninklijke Philips Electronics N.V., Eindhoven (NL)

( * ) Notice: Subject to any disclaimer, the term of this patent is extended or adjusted under 35 U.S.C. 154(b) by 360 days.

(21) Appl. No.: 13/002,981

(22) PCT Filed: Jul. 7, 2009

(86) PCT No.: PCT/NL2009/050407
§ 371 (c)(1),
(2), (4) Date: Aug. 24, 2011

(87) PCT Pub. No.: WO2010/005301
PCT Pub. Date: Jan. 14, 2010

(65) Prior Publication Data
US 2011/0297996 A1      Dec. 8, 2011

(30) Foreign Application Priority Data
Jul. 8, 2008  (EP) ..................................... 08159929

(51) Int. Cl.
*H01L 29/20*     (2006.01)

(52) U.S. Cl.
USPC ........ 257/204; 257/183.1; 361/748; 361/750; 361/751; 361/752; 361/760; 361/765; 361/767; 361/768; 361/772; 361/736; 361/764; 361/763; 361/737; 361/739; 174/250; 174/255; 174/260; 174/261; 174/262; 174/263; 313/504; 313/506; 313/509; 313/510; 313/511; 313/512; 349/150; 349/158

(58) Field of Classification Search
USPC .............. 257/204, 183.1; 361/748, 750–752, 361/760, 765, 767, 768, 772, 736, 764, 763, 361/737, 739, 757; 174/250, 255, 260–263; 313/504, 506, 509–512; 349/150, 158
See application file for complete search history.

(56) References Cited

U.S. PATENT DOCUMENTS 7,417,867 B1    8/2008  Matsuda et al.
7,510,885 B2    3/2009  Halls et al.
(Continued)

FOREIGN PATENT DOCUMENTS

CN    1290121 A    4/2001
CN    1729571 A    2/2006
(Continued)

OTHER PUBLICATIONS

Japanese Office Action dated Mar. 26, 2013, issued in Japanese counterpart Application No. 2011-517365.
(Continued)

*Primary Examiner* — Michael Shingleton
(74) *Attorney, Agent, or Firm* — Novak Druce Connolly Bove + Quigg LLP

(57) ABSTRACT

An electronic device comprises a functional stack (10) and a cover (50) coupled thereto by an insulating adhesive layer (30). The functional stack (10) comprises a first transparent and electrically conductive layer (22), a second electrically conductive layer (24) and a functional structure (26), comprising at least one layer, sandwiched between said first and second conductive layer.
The cover (50) includes a substrate (52) and at least a first conductive structure (66, 68) that is arranged in a first plane between the adhesive layer (28) and the substrate (52). First and second transverse electrical conductors (32, 34) transverse to the first plane (61) electrically interconnect the first and the second electrically conductive layer (22, 24) with the first and the second conductive structure (66, 68) in the first plane (61).

5 Claims, 21 Drawing Sheets

(56) References Cited

U.S. PATENT DOCUMENTS

| | | |
|---|---|---|
| 2004/0227459 A1* | 11/2004 | Imura ............................ 313/504 |
| 2005/0104089 A1* | 5/2005 | Engelmann et al. .......... 257/204 |
| 2006/0125383 A1 | 6/2006 | Liu et al. |
| 2006/0152833 A1 | 7/2006 | Halls et al. |
| 2006/0181199 A1 | 8/2006 | Lee et al. |
| 2007/0011983 A1 | 1/2007 | Reynolds et al. |
| 2007/0273276 A1 | 11/2007 | Ottermann et al. |
| 2008/0157661 A1 | 7/2008 | Kajikawa et al. |

FOREIGN PATENT DOCUMENTS

| | | |
|---|---|---|
| EP | 0 171 787 A1 | 2/1986 |
| EP | 0 986 112 A2 | 3/2000 |
| EP | 1 087 649 A2 | 3/2001 |
| EP | 1 191 820 A1 | 3/2002 |
| JP | 2004-14447 A | 1/2004 |
| WO | 2006/087653 A2 | 8/2006 |
| WO | 2007/004115 A2 | 1/2007 |
| WO | 2007/013001 A2 | 2/2007 |
| WO | 2007/036850 A2 | 4/2007 |

OTHER PUBLICATIONS

First Office Action from the Chinese Patent Office in counterpart Chinese Patent Application No. 200980134041.7 (with translation of text) dated Aug. 9, 2012.

* cited by examiner

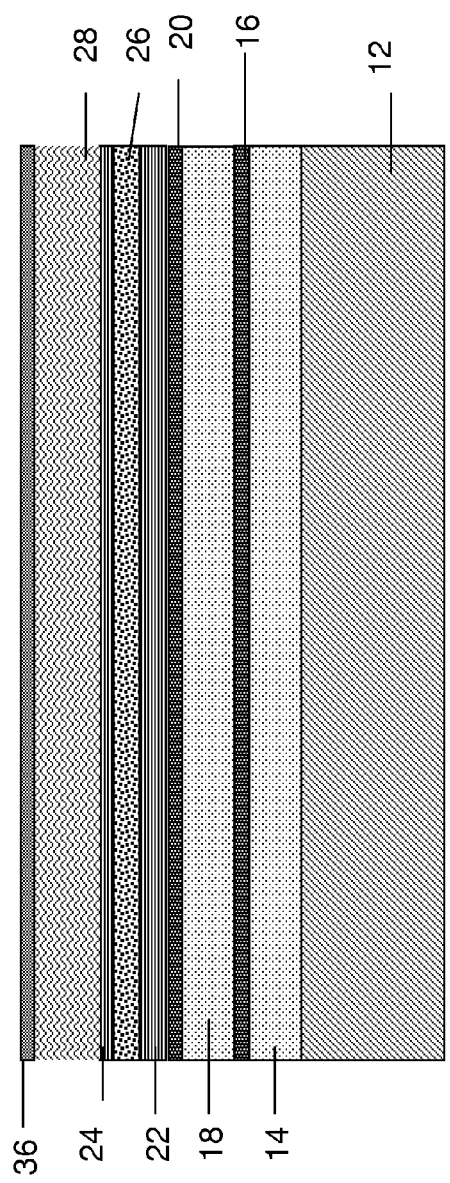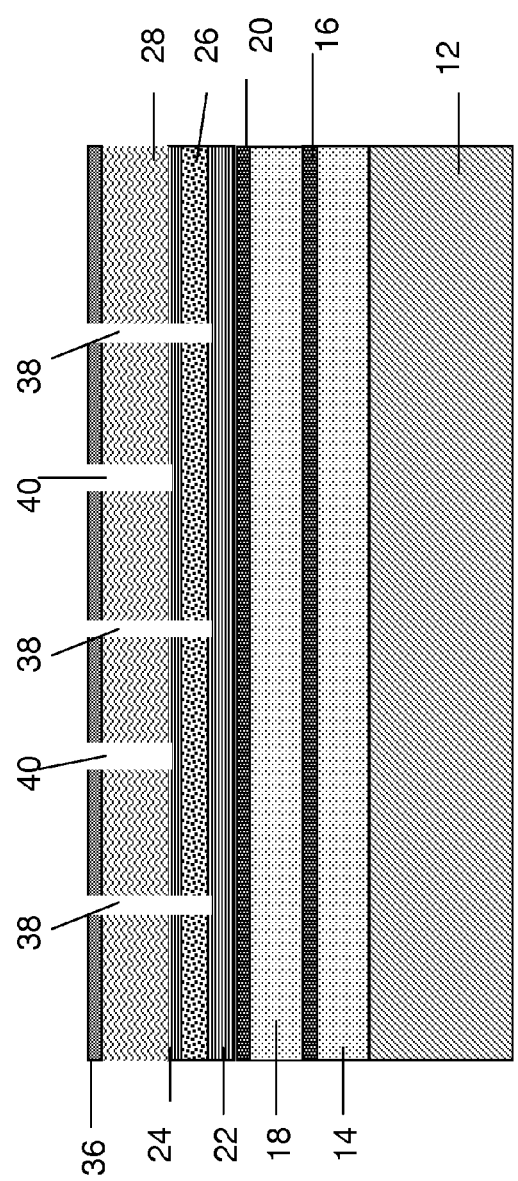

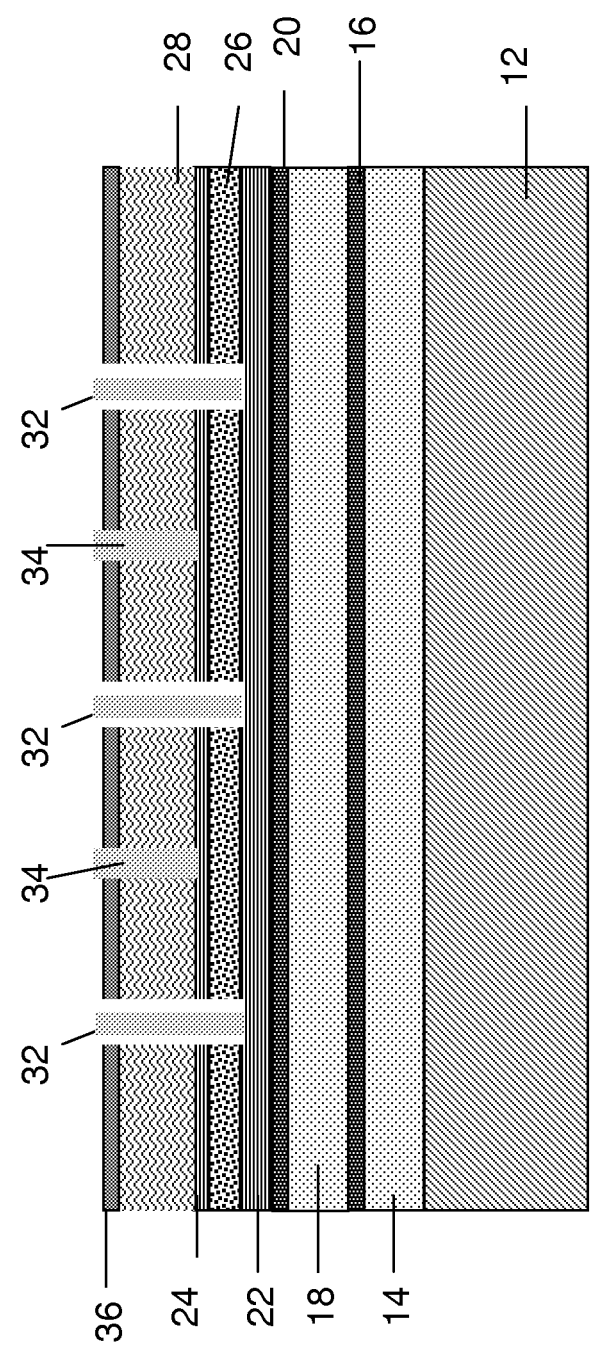

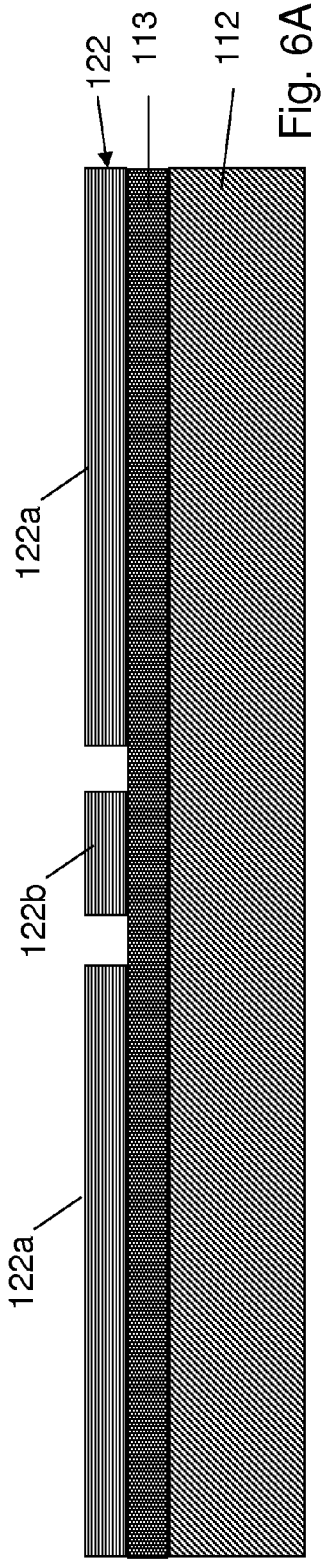
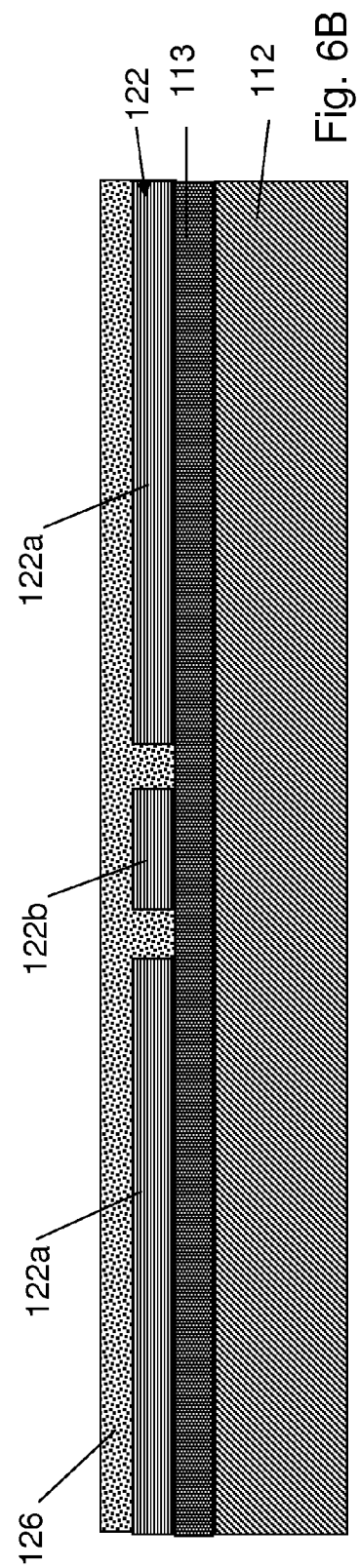
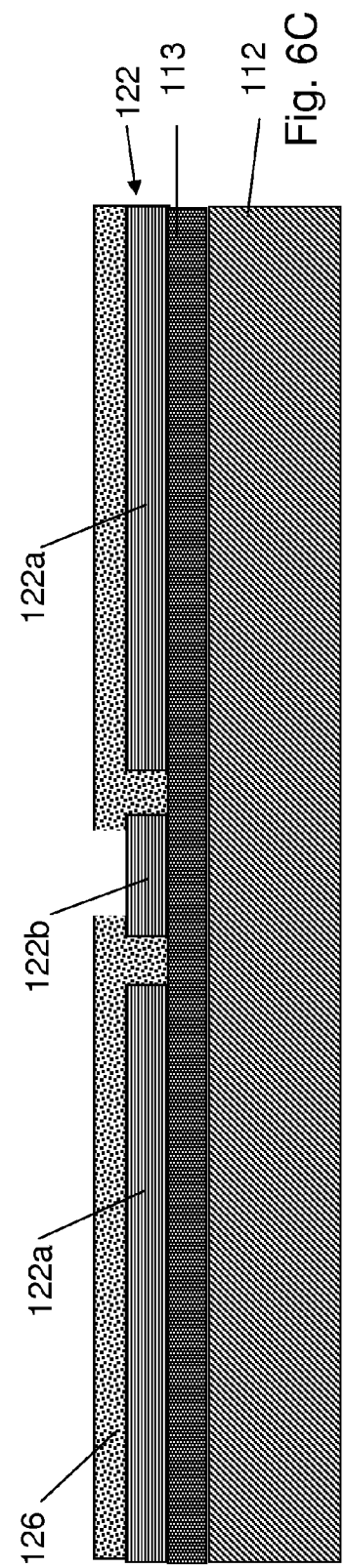

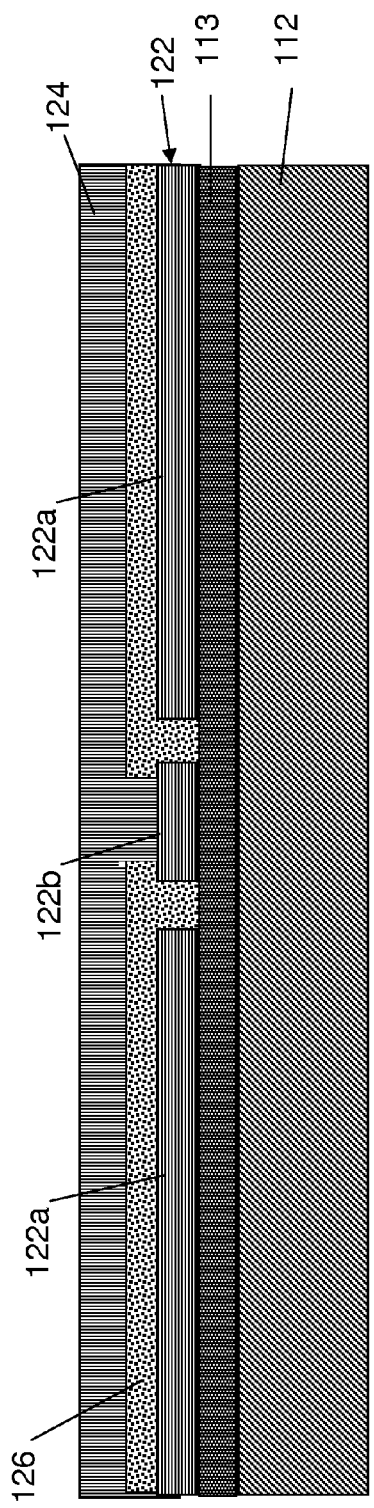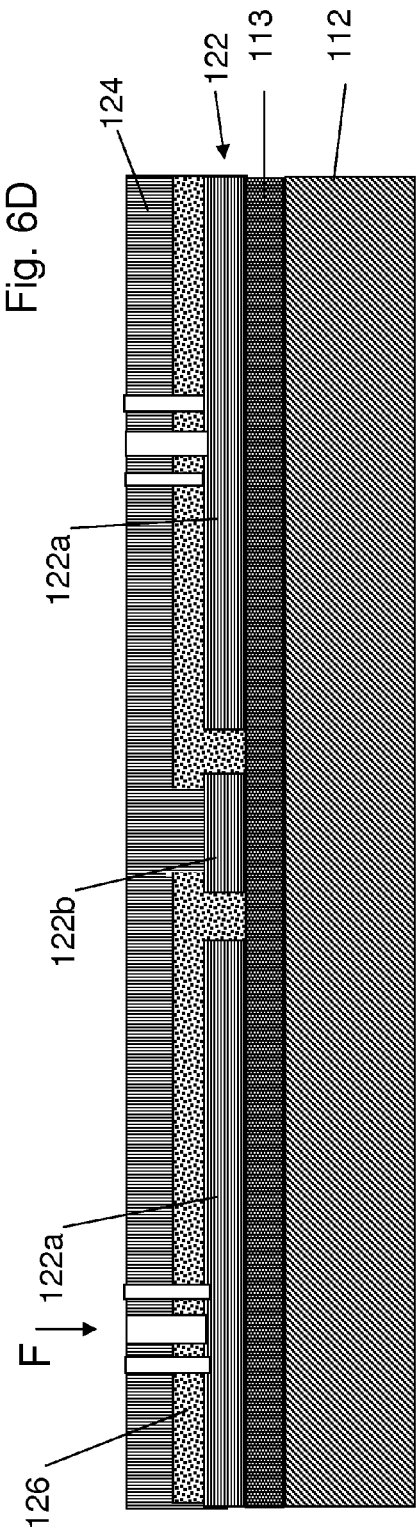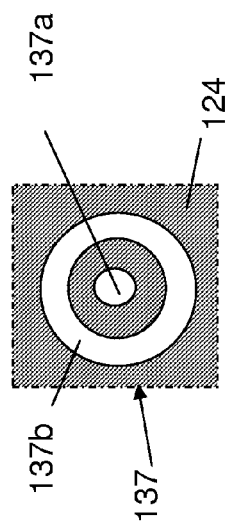

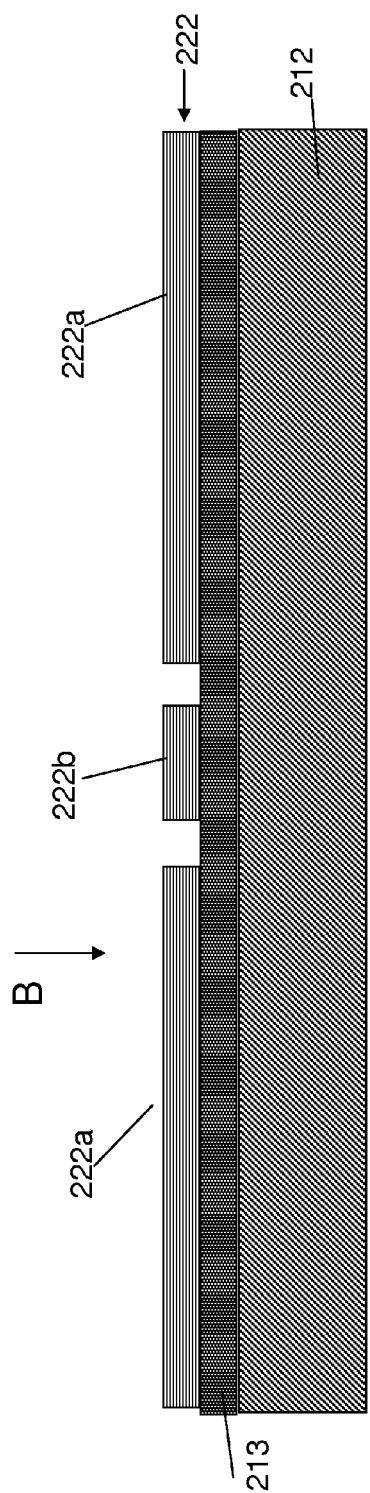
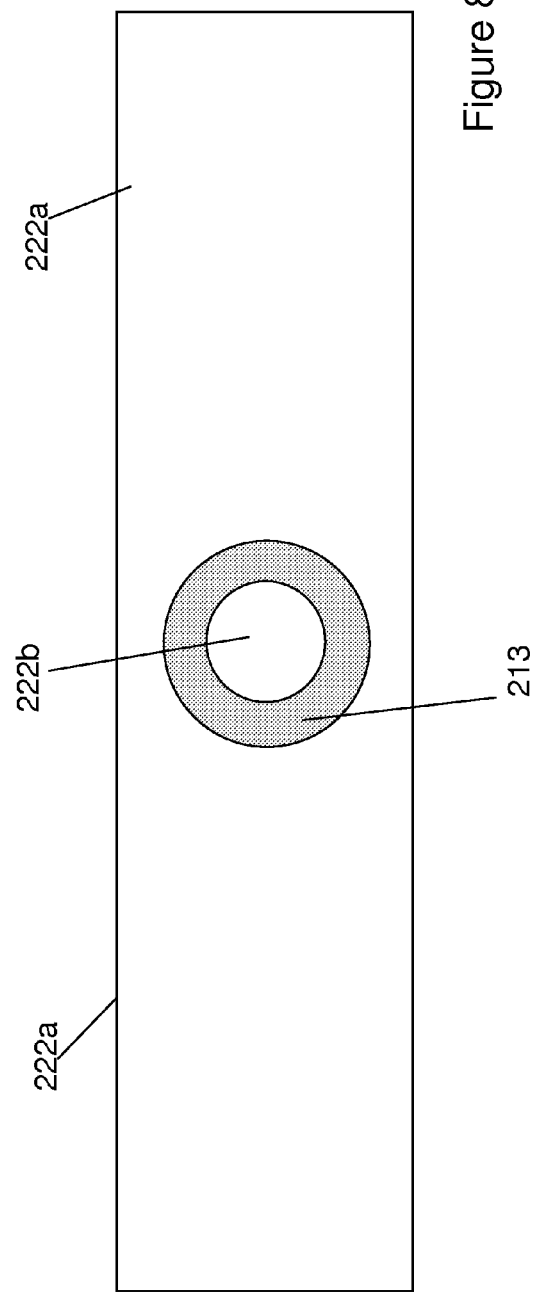
Figure 8A
Figure 8B

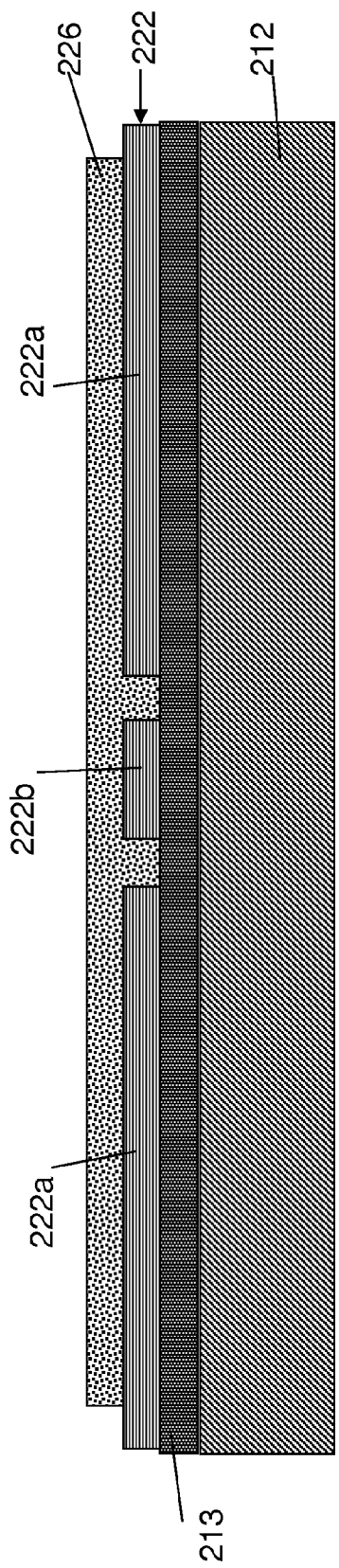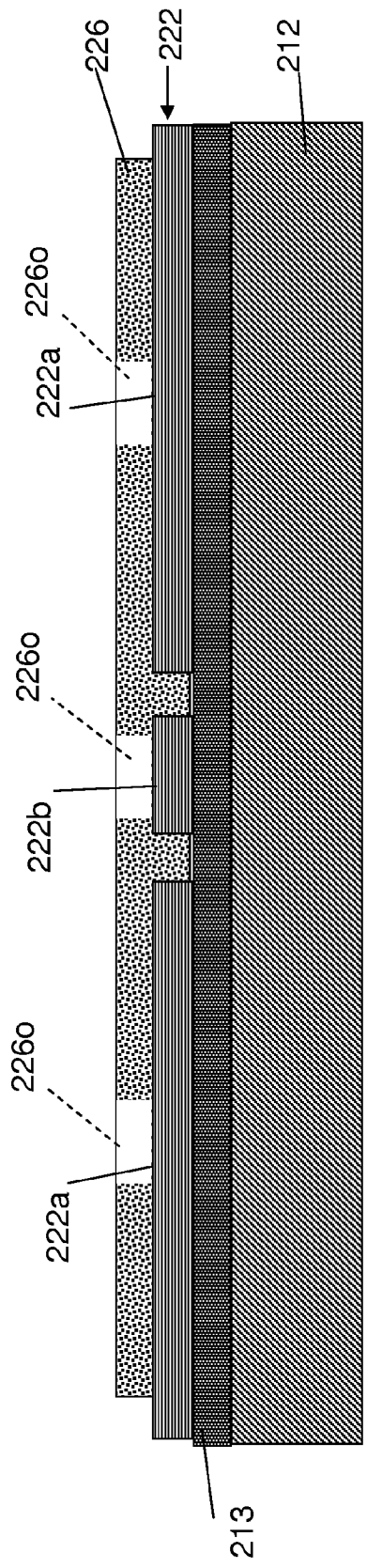

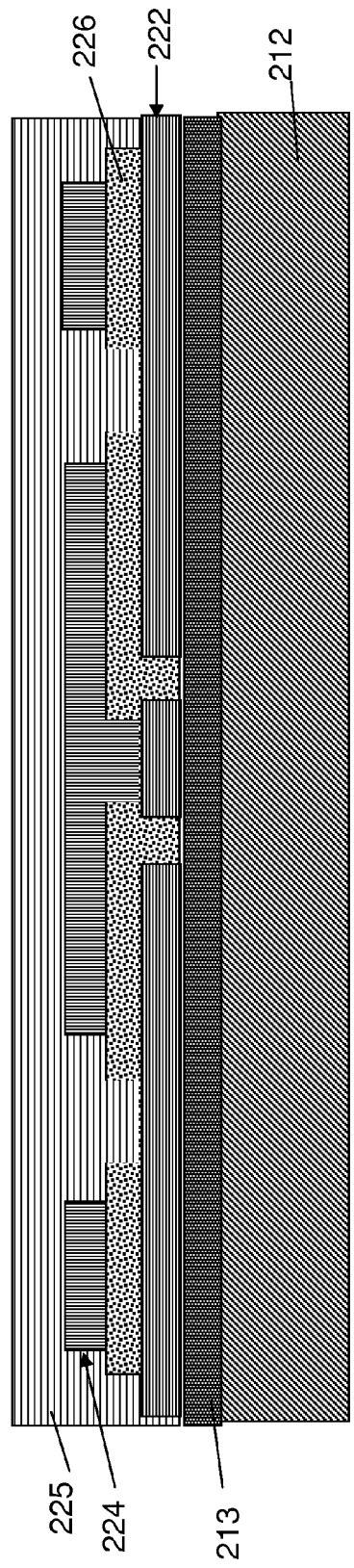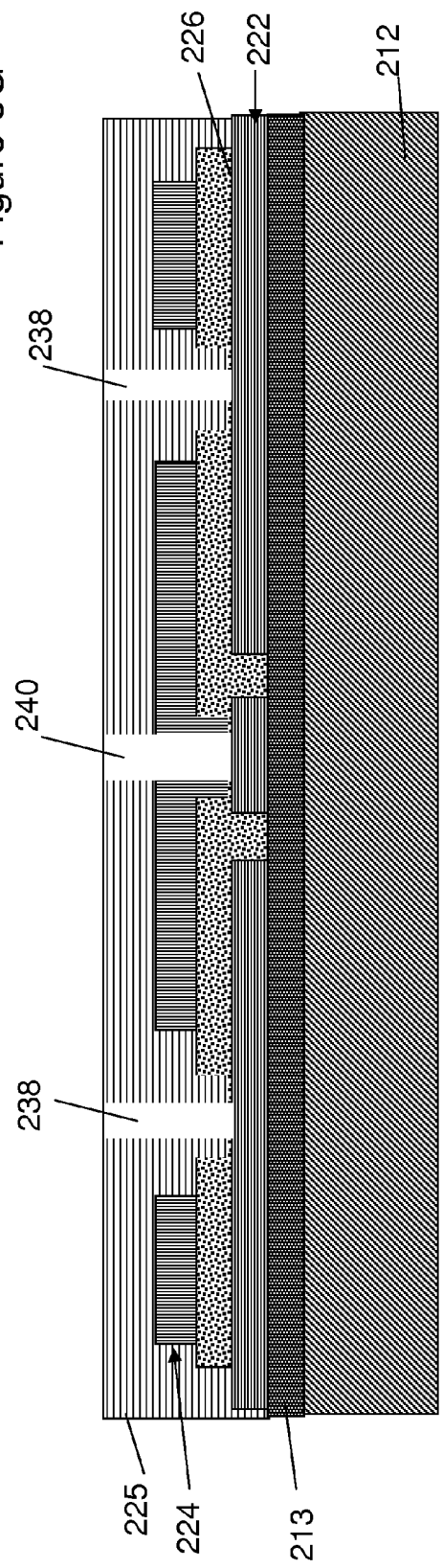

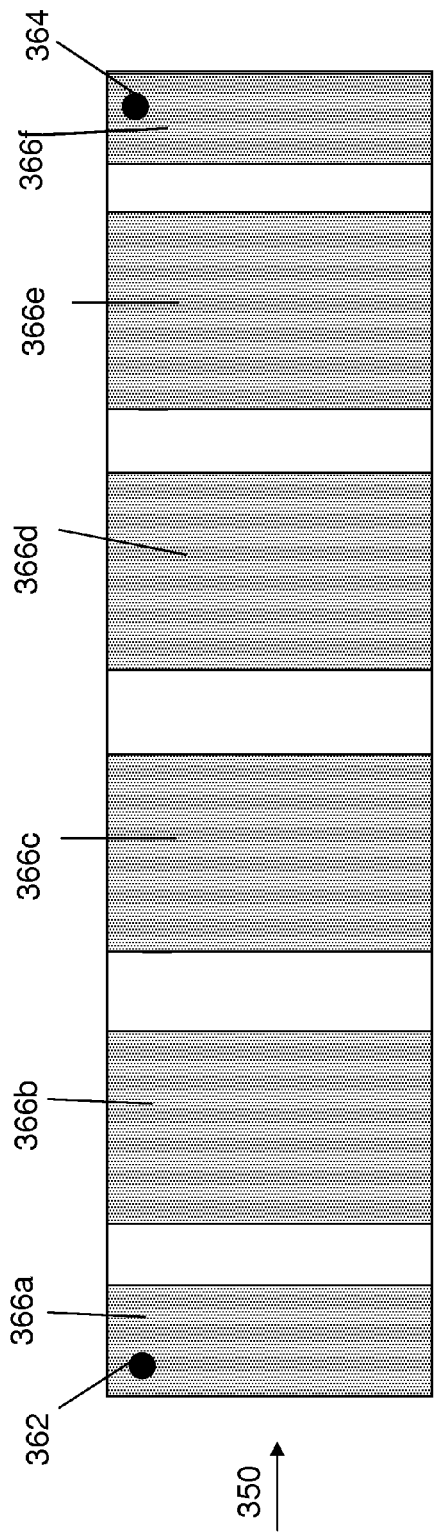
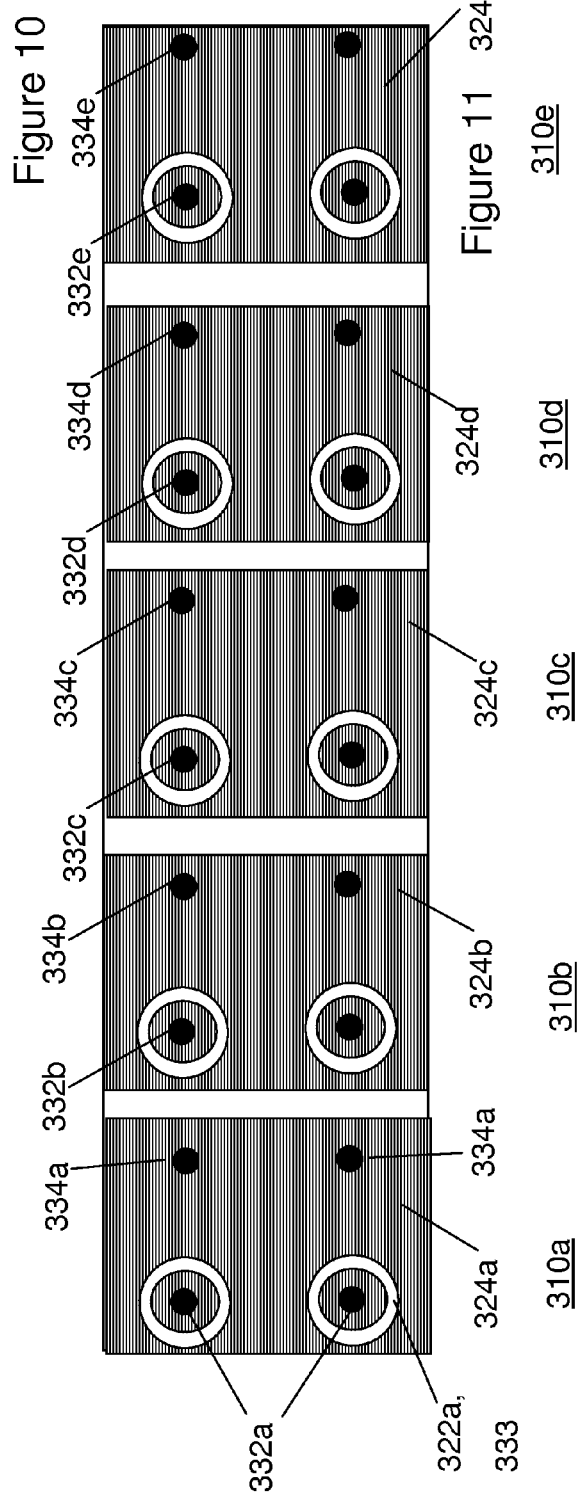

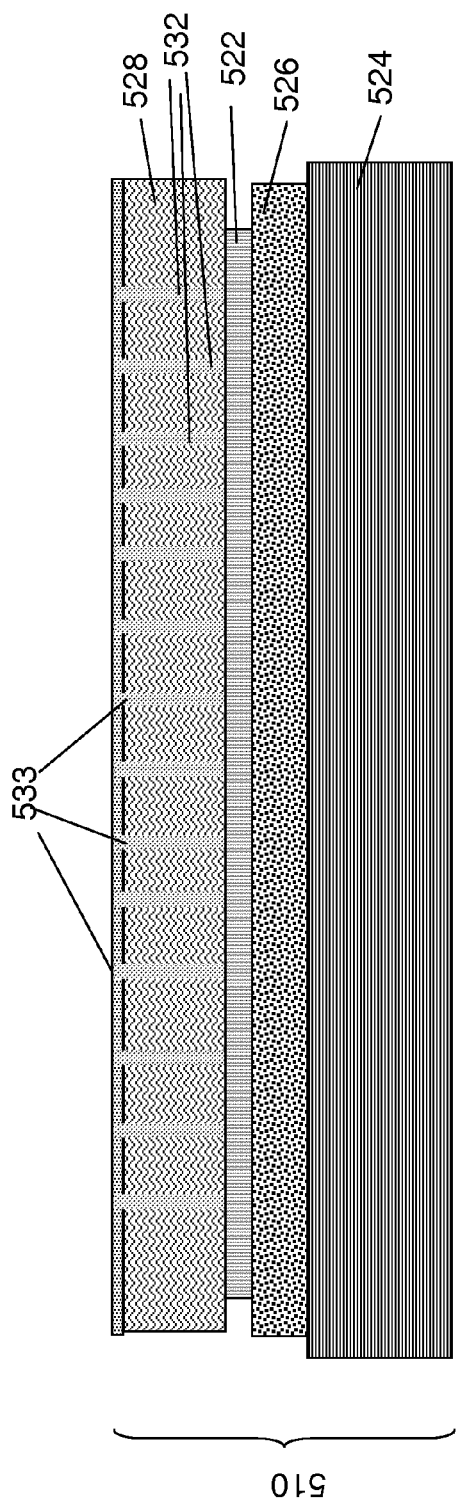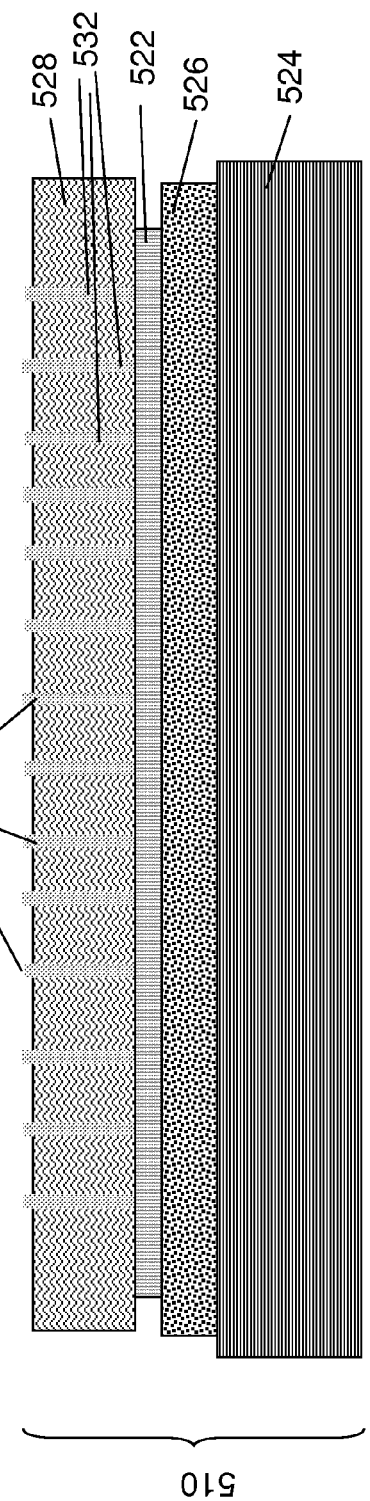

ELECTRONIC DEVICE AND METHOD OF MANUFACTURING THE SAME

CROSS-REFERENCES TO RELATED APPLICATIONS

This application is a National Stage of International Application No. PCT/NL2009/050407, filed Jul. 7, 2009, and which claims the benefit of European Patent Application No. 08159929.2, filed Jul. 8, 2008, the disclosures of which are incorporated herein by reference.

BACKGROUND OF THE INVENTION

1. Field of the Invention

The present invention relates to an electronic device, in particular an opto-electric and/or electro-optic electric device.

The present invention further relates to a method of manufacturing an electronic device.

2. Related Art

An opto-electric device is defined herein as a device that converts (e.g. visible) radiation into electric power, or into an electric signal, such devices include for example photo voltaic cells, e.g. organic photo voltaic cells (OPVs). An electro-optic device is understood to be a device having an optic property that depends on an electric signal, such as light emitting diodes, for example organic light emitting diodes (OLEDs) and electrochromic devices. Such devices generally have an optically functional structure that is sandwiched between a first and a second electrode layer. In case of a photovoltaic cell, the optically functional structure comprises at least one opto-electric layer for converting radiation into a current. In case of a light emitting diode the functional structure comprises at least one electro-optic layer for converting an electric current into radiation. At least one of the electrode layers has to be relatively thin, in order to allow radiation to pass to or from the functional layer. Due to the limited thickness, the electric conductivity of that at least one electrode layer is also limited. In photovoltaic cells this has the disadvantages of relatively high ohmic losses. Organic devices have gained increased attention as such devices can be manufactured at relatively low temperatures and relatively cheap manufacturing conditions. In particular Organic Light Emitting Diodes (OLED's) become important for use in displays and for illumination purposes. In OLEDs, in particular in large area OLEDs, i.e. OLEDS having a light emitting area larger than a few square centimeters an additional disadvantage of the low conductivity is that a large voltage drop over the area occurs, which causes an inhomogeneous luminance over the area.

From US 2006/0125383 a method is known for manufacturing a large area OLED in a roll-to-roll process. According to this method a first, a second and a third component are laminated together. The first and the second component comprise a substrate coated with one or more layers of OLED material. The third component comprises a further substrate with one or more layers of adhesive materials. In an embodiment the second component is provided with openings substantially perpendicular to the second substrate. When manufacturing various types of electric devices, such as photovoltaic cells and OLEDs, it is attractive if such devices can be rapidly manufactured from semi-finished products in case of an unexpected demand for one such device. The known product is manufactured by providing an adhesive within the openings of the second component and integrating the three components. Therein the adhesive bonds the third component to the first component via the adhesive in the openings. The process of simultaneous lamination of three components therewith applying adhesive within the openings of the middle component is relatively complex. Moreover, it is not possible to evaluate the correct operation of the device prior to full assembly of the product.

SUMMARY OF THE INVENTION

It is a purpose of the invention to provide an electronic device that can be manufactured with an improved manufacturing method. It is a further purpose of the invention to provide an improved method for manufacturing an electronic product. It is a further purpose of the invention to provide a first component that can be assembled with and a second component into an electronic device.

According to a first aspect of the present invention an electronic device is provided according to claim 1. Contrary to the product known from the US patent application cited above, in the electronic device according to the present invention an electrically insulating adhesive layer is applied between the first and the second part, and the transverse electric conductors extend through the adhesive layer to at least one of the electrically conductive layers of the first part.

The electronic device can be manufactured by lamination of a first and a second component. The first component comprises a functional stack, forming an OLED or OPV for example on a first substrate and the second component is a cover forming a power plane on a second substrate respectively. The first and the second component can be manufactured in a cheap roll-to-roll process. Contrary to the known product, the first part comprising the functional stack, e.g. the OLED or the OPV, itself need not be formed by lamination but may be completed on one substrate before the lamination of the two foils.

The at least one electrically conductive structure may serve as a power supply support to one of the first electrically conductive layer and the second electrically conductive layer. The electrically conductive layer that is supported in this way can be relatively thin so that it has a good transparency for radiation produced in the device or radiation entering the device. The other layer that is not supported may be relatively thick, dependent on the lateral dimensions of the device. In an advantageous embodiment at least a first and a second electrically conductive structure and first and second transverse electrical conductors are present, wherein the first and the second transverse electrical conductors electrically interconnect the first and the second electrically conductive layer with the first and the second conductive structure respectively. In this embodiment the thickness of both electrically conductive layers in the first part are independent of the lateral dimensions of the first part. Accordingly in this embodiment the first part is fully scalable, so that the same manufacturing process can be used for manufacturing a large class of end products.

In manufacturing the first component, the functional stack is formed and covered by the adhesive layer. Holes are formed through the adhesive layer towards at least one of the first and the second electrically conductive layer, for example by laser drilling and filled with an electrically conductive material to form the transverse electrical conductors. The first and the second component can be integrated into an end product by lamination without further complicated processing steps.

The first and the second component can be tested each before lamination, so that fall-out in a late stage of the manufacturing process is reduced.

It is favourable if the holes are formed, and subsequently filled with an electrically conductive material after the functional stack, including the adhesive layer and possibly a release liner is completed. This has the advantage that all layers can be applied by blanket deposition, which simplifies the manufacturing process. However, this is not necessary. Any pattern in any of the layers may be formed at any stage of the manufacturing process. For example the pattern in a layer may be applied during the deposition process, by using a patterned deposition process, such as printing, or the pattern may be applied by drilling or etching immediately after the layer is applied. A release liner is understood to be a paper or plastic based carrier web material, which is coated on one or two sides with a release agent, which provides a release effect against any type of a sticky material such as an adhesive or a mastic.

Depending on the offer and demand for various types of devices it may be decided at any moment whether the cover foil is to be used for manufacturing a light emitting product by integrating it with a first component comprising an electro-optic active layer, or for manufacturing a photo voltaic product, by integrating it with an first component having an opto-electric active layer. The final size and shape of the OPV and OLED products is decided just prior to contact formation and lamination.

In an advantageous embodiment the holes are formed after the functional stack, including the adhesive layer has been completed. In this embodiment the functional stack is formed by blanket deposition of the functional layers and provided with a release liner. This blanket deposition facilitates ease of manufacturing and the so obtained semi-finished product is generic for all products. Furthermore, in this embodiment any debris formed during drilling and filling is left at the release liner. The release liner may be released immediately before lamination with the cover. In the lamination process the transverse first and second electrical conductors are brought into contact with the first and the second electrically conductive structure at the cover.

In another advantageous embodiment the first electrically conductive layer has a first and a second segment that are mutually electrically insulated and that are arranged in a second, common plane, wherein the first segment of the first electrically conductive layer is electrically connected to the first conductive structure, and wherein the second electrically conductive layer is electrically interconnected to the second conductive structure via the second electrical conductor and the second segment of the first electrically conductive layer. As in this embodiment the electrical connection of the second electrically conductive structure to the transverse conductor is formed via a segment of the first electrically conductive layer, the second electrically conductive layer can be relatively thin and therewith have a relatively high transparency. Accordingly a dual-side radiating OLED can be formed provided that the electrically conductive structures at the cover leave a sufficiently high fraction of the surface free. In practice it has been found that the electrically conductive structures still have a sufficient conductivity if they cover about 10% of the surface of the substrate of the cover.

The application of first and second transverse electric conductor that respectively connect the first and the second electrically conductive layer with the first and second electrically conductive structure, and wherein the first and the second electrically conductive structure cover not more than 10% of the surface of the cover is particularly relevant for electrochromic devices, for example to be used in windows.

In a further embodiment, the first transverse conductors coupled to the first electrically conductive layer are surrounded by an insulating zone that insulates these conductors from the second electrically conductive layer. The insulating zone may be applied directly adjacent to the first transverse conductors, but may alternatively be applied at a distance from the transverse conductors. For example, in an embodiment the second electrically conductive layer is provided with holes having an inner portion for the first transverse conductor and a ring-shaped outer-portion separate from the inner portion. It is sufficient if the insulating zone is present between the first transverse conductor and the second electrically conductive layer. For manufacturing purposes it may be preferred that the insulating zone extends over the full length of the first transverse conductor, so that the insulating zone can be manufactured in a single step after all layers of the functional stack are applied. An insulating zone may be applied by removing a ring shaped volume of material around the first transverse electrical conductor after all layers of the functional stack are applied. Alternatively a first hole extending to the first electrically conductive layer may be drilled that is filled with an electrically insulating material. Subsequently a smaller hole may be drilled within this electrically insulating material in which the first transverse electrical conductor is arranged. The insulating zone may be left free of material or may be filled with an insulating material. An insulating zone may be superfluous if an anisotropic material is used for the transverse conductors that only conducts in the transverse direction.

The electronic device according to the invention may comprise a first and a second conductive structure, wherein the first conductive structure is electrically connected via the first transverse electrical conductors to the entire first electrically conductive layer and the second electrically conductive structure is electrically connected via the second transverse electrical conductors to the entire second electrically conductive layer. In this parallel arrangement the OLED can be driven with a relatively low voltage, or an OPV is provided with a relatively low voltage output. In an alternative arrangement the functional stack is partitioned into functional stack segments, each functional stack segment comprising a segment of the first electrically conductive layer and a segment of the second electrically conductive layer, the functional stack segments being serially arranged, in that at least one segment of the first electrically conductive layer is electrically connected to a segment of the second electrically conductive layer via a conductive structure at the cover. In this serial arrangement the OLED can be driven with a relatively high voltage but a low drive current. Consequently, demands on the electrical conductivity of the first and second electrically conductive structure are less stringent. Analogously in this way an OPV may be provided with a relatively high voltage output, while the current load of the first and second electrically conductive layer is modest.

BRIEF DESCRIPTION OF THE DRAWINGS

These and other aspects are described in more detail with reference to the drawing. Therein FIG. 6A-6G show a method of manufacturing the electronic device of FIG. 5, FIG. 8A-8H show a method of manufacturing the electronic device of FIG. 7, FIG. 10 shows a part of the electronic device of FIG. 9 according to bottom-view X in FIG. 9, FIG. 11 shows a cross-section of another part of the electronic device of FIG. 9 according XI in FIG. 9, FIG. 15A to 15D illustrates a method of manufacturing the electronic device of FIG. 14.

DETAILED DESCRIPTION OF EMBODIMENTS

Figure 1:
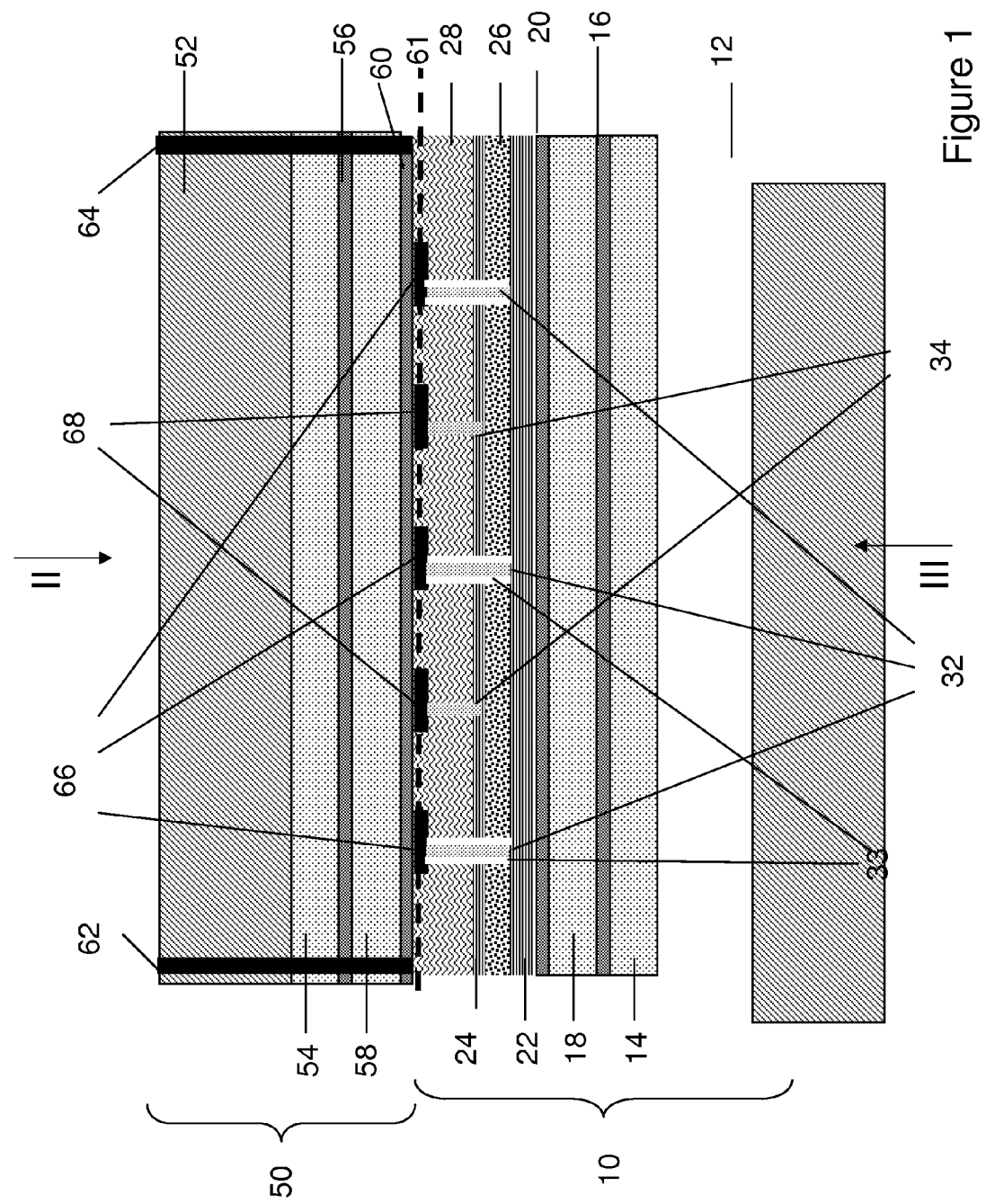
FIG. 1 shows a first embodiment of an electronic device according to the invention.

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

Figure 3:
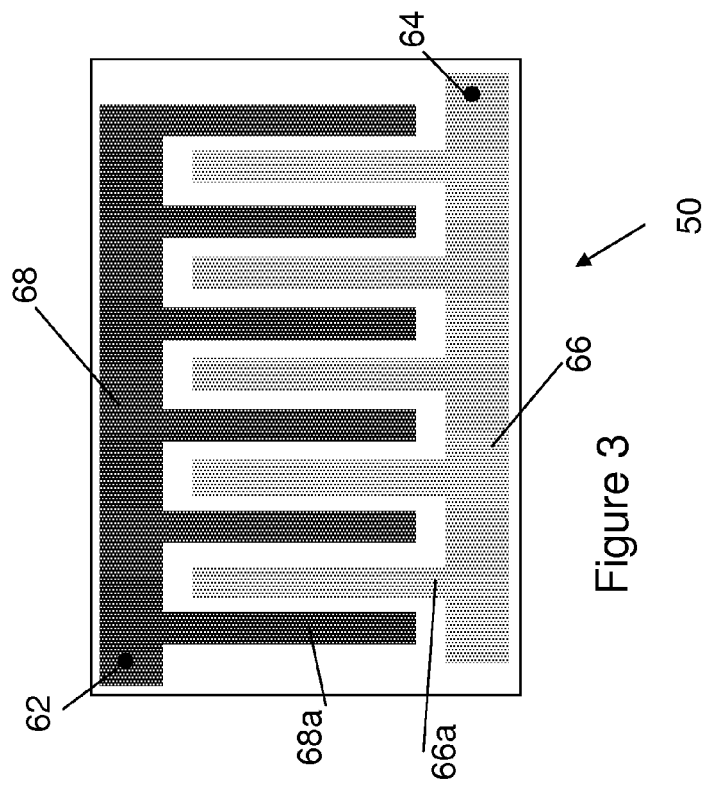
FIG. 3 shows a second part of the electronic device of FIG. 1, FIG. 4A-4C show a method of manufacturing the electronic device of FIG. 1.
Figure 2:
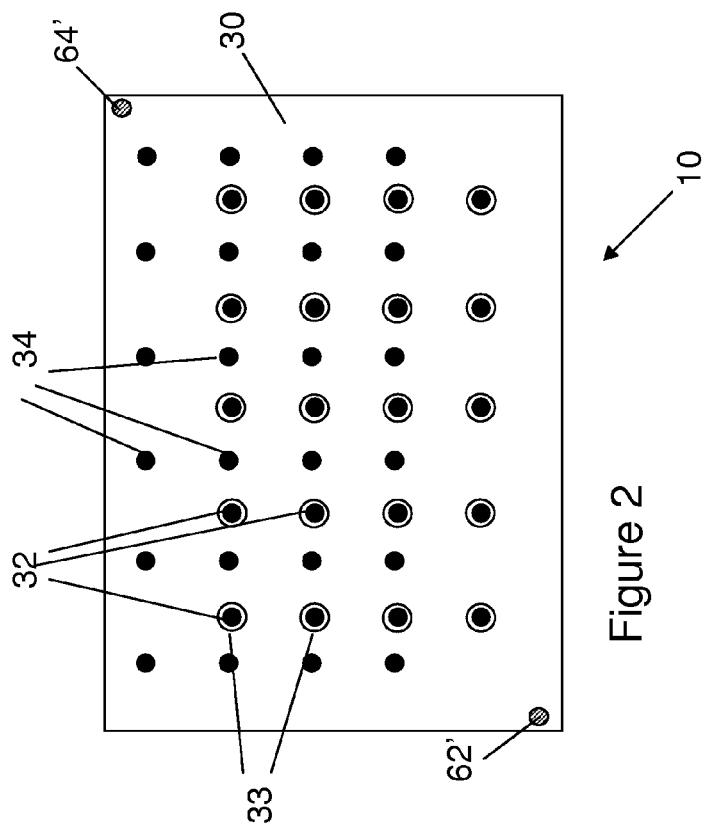
FIG. 2 shows a first part of the electronic device of FIG. 1.

FIG. 1 shows a first embodiment of an electronic device, comprising a functional stack 10 as a first component and a cover 50 as a second component. FIG. 2 shows the first component 10 according to top-view II in FIG. 1, and FIG. 3 shows the second component 50 according to bottom-view III in FIG. 1.

The cover 50 is coupled to the functional stack 10 by an insulating adhesive layer 28. The adhesive layer 28, having a thickness in the range of 15-100 μm, adheres the functional stack 10 to the cover 50. The adhesive of the adhesive layer 28 may be cured after application. Suitable adhesives are for example acrylates, epoxies and silicones. But also hotmelt (for example EVA-based) thermoplastic adhesives may be used. The functional stack 10 comprises a first transparent and electrically conductive layer 22 that is applied at a substrate 12 provided with a first barrier structure in the form of a barrier stack. As a substrate a material like PET (Poly Ethylene Terephthalate) or PEN (Poly Ethylene Naphthalate) or PC (polycarbonate) may be used. The substrate may for example have a thickness in the range of 50 to 250 µm, e.g. 125 µm. The barrier stack comprises a first inorganic layer 16, having a thickness in the range of 1-500 nm, preferably about 300 nm, a first organic layer 18, having a thickness of 0.1-100 nm, preferably about 20 µm, and an second inorganic layer 20 having a thickness of 1-500 nm, preferably 300 nm. Layer 18 decouples the inorganic layers 16, 20 and may additionally function as a planarization layer. The barrier stack is applied at the substrate 12 that may have an (optional) planarization layer 14. The organic planarization layer 14 has a thickness in the range 0.1-100 nm, preferably about 20 µm. The first transparent, electrically conductive layer 22 is for example a layer of a transparent conducting metal oxide, e.g. a layer of indium tin oxide (ITO), zinc oxide (ZnO) or tin oxide (SnO). The first transparent, electrically conductive layer 22 has a thickness in the range of 50-300 nm, for example 150 nm. Alternatively or additionally a sufficiently conducting transparent organic material such as PEDOT may be used or a thin metal. The functional stack comprises a second electrically conductive, not necessarily transparent layer 24, e.g. a layer of Barium having a thickness of about 5 nm combined with a layer of aluminium having a thickness in the range of 100-400 nm.

A functional structure 26 is sandwiched between said first and second conductive layer 22, 24. Depending on its function, the functional structure 26 may comprise one or more functional layers. For example in case that the electronic device is an OLED, the functional structure comprises at least one layer of a light emitting material, such as polymeric PPV or layer stacks and mixtures of small molecule including emitters such as IrPy. In addition the functional structure may comprise a hole injection layer (HIL) between the layer of light emitting material and the electrically conductive layer forming the anode, and or an electron transport layer between the layer of light emitting material and the electrically conductive layer forming the cathode. Suitable materials are for example aluminium, copper or silver.

In case the electronic device is a photovoltaic cell, the functional structure may comprise a combination of an electron-donating layer and an electron-accepting layer. For example the first conductive layer is an ITO layer having a thickness of 125 nm and the second conductive layer is an aluminium layer having a thickness of 100 nm, between which is arranged a 75 nm PEDOT and a 100 nm blend layer (MDMO-PPV: PCBM 1:4).

The cover 50 includes a substrate 52 and a first and a second mutually insulated conductive structure 66, 68 applied at the substrate 52. As a substrate a material like PET (Poly Ethylene Terephthalate) or PEN (Poly Ethylene Naphthalate) or PC (polycarbonate) may be used. The substrate may for example have a thickness in the range of 50 to 250 µm, e.g. 125 µm. The first and the second mutually insulated conductive structure 66, 68 are arranged between the adhesive layer 28 and the substrate 52. The first and second mutually insulated conductive structure 66, 68 may thereby be submerged in the surface of the adhesive layer 28. Suitable materials for the conductive structures 66, 68 are Copper, Silver and Aluminium. In the case of copper, suitable conductive structures can be formed by electroplating processes, for example as described in EP1843383. The conductive structures 66, 68 may have a thickness in the order of 10 to 50 µm, for example 25 µm. The structures may have branches that are 100 to 300 µm wide. In order to have a sufficiently low resistance for a good operation of the device, it is sufficient that the conductive structures 66, 68 cover about 10% of the surface of the substrate. The cover then still has a good transparency. For example this is achieved if subsequent branches of the conductive structures are spaced apart at a distance of 1 to 3 mm. However, if it is only required that the functional stack is transmissive for radiation at one side of the device, the conductive structures may cover substantially the entire substrate 52.

The cover 50 is further provided with a barrier structure comprising a third inorganic layer 56, a second organic layer 58 and a fourth inorganic layer 60. The barrier structure 56, 58, 60 is arranged between the substrate 52 and the first and the second mutually insulated conductive structure 66, 68. Suitable materials for the barrier structure in these and other embodiments of the present invention are described in earlier filed European patent application EP08156493.2. The cover is further provided with a first and a second electric main conductor 62, 64 that provide for an electrical connection from the first and a second mutually insulated conductive structure 66, 68 to further conductors outside the device. Alternatively, such main conductors 62', 64' may be provided in the functional stack 10.

First electrical conductors 32 transverse to the first plane 61 electrically interconnect the first electrically conductive layer 22 with the first conductive structure 66 in the first plane 61. Second electrical conductors 34 transverse to the first plane 61 electrically interconnect the second electrically conductive layer 24 with the second conductive structure 68. In favourable embodiments the electrical conductors 32, 34 may be formed by Cu, Ag or C-based inks, pastes or adhesives or by electroless growing of a metallic conductor after filling with a suitable seed-material.

The first electrical conductors 32 are insulated from the second electrically conductive layer 24 by a ring-shaped zone 33. In this case the ring-shaped zone 33 extends over the full length of the first electrical conductor 32. It is sufficient however, if only the cathode layer (second electrically conductive layer 24) is ablated away around the zone filled by the first electrical conductor 32. The ring-shaped zone 33 may be filled with an electrically insulating material, but may alternatively left free of material.

The product shown in FIG. 1 may be efficiently manufactured by laminating the first component 10, the function stack, with the second component 50, the cover with the electrically conductive structures.

A method of manufacturing the functional stack is now described with reference to FIGS. 4A-4E. According to a method according to the invention, the substrate 12 is provided. Optionally a planarization layer 14 may be applied. The planarization layer is deposited for example by gravure printing (in vacuum), or slot-die coating. Next a first barrier structure is provided by subsequently applying application of a first inorganic layer 16, the first organic layer 18 and the second inorganic layer 20. The inorganic layers 16, 20 may be applied by a deposition of SiNx:H, for example by PECVD. The deposition may be preceded by a surface treatment. The intermediate organic layer 18 may be deposited by gravure printing or slot-die coating.

Then a first transparent electrically conductive layer 22 is applied, followed by the functional structure 26 comprising one or more functional layers. Next the second electrically conductive layer 24 is applied. The electrically conductive layer 22, for example an ITO layer may be applied by (rotatable) magnetron sputtering and subsequent annealing at a temperature of less than 150° C. The dual electrically conductive layer 24 may be applied by thermal evaporation for example. The electrically conductive layer 24 is provided with an electrically insulating adhesive layer 26, which is optionally covered with a release liner 36 on its turn. The functional structure may comprise one or more active layers, e.g. electro-optically active layers, optical-electric active layers, hole injection layers, electron transport layers etc. The one or more active layers may for example be applied by one or more of the methods spin coating, gravure/flexo printing, and slot-die coating. With these steps, requiring no patterning, the result shown in FIG. 4A is obtained.

FIG. 4B shows how first and second holes 38, 40 having a diameter of 25-250 μm are formed through the adhesive layer 26 and the release liner 36. The first holes 38 extend towards the first transparent electrically conductive layer 22. The second holes 40 extend towards the second electrically conductive layer 24.

The result as shown in FIG. 4C is obtained by applying an electrical conductive material in the holes 38, 40 therewith forming electrical conductors 32, 34. After application of the electrical conductors 32 a ring-shaped recess 33 having an outer diameter of for example 50-275 μm is formed around the electrically conductive material in the first holes 38. The ring-shaped recesses 33 are filled with an insulating material but may alternatively be left free. The first and the second holes 38, 40, as well as the ring-shaped recesses 33 are preferably formed by laser drilling.

It is noted that instead of applying the holes 38, 40 in a single step after application of the last layer of the functional stack 10, the holes 38, 40 and the recesses 33 may be formed alternatively by a patterned deposition of the layers of the functional stack 10, and laminating an adhesive layer 26 provided with perforations at the locations corresponding to the holes and the recesses.

In order to provide for a long-term protection of the product, measures may be taken to protect the device from the ingress of moisture, for example the side-faces of the functional stack may be sealed with a barrier material.

The cover 50 may be manufactured by application of a stack of layers 54, 56, 58, 60 at the substrate 52 by a method similar as used for applying the layers 14, 16, 18, 20 at the substrate 12. Subsequently, for example electroplating, for example by a method as referred to above, may be used to apply the first and a second mutually insulated conductive structure 66, 68 at the stack 54, 56, 58, 60. The first and a second mutually insulated conductive structure 66, 68 have a thickness depending on the size of the required product.

The barrier structure formed by the layers 16, 18 and 20 of the first part 10 on the one hand and the barrier structure formed by the layers 56, 58, 60 of the second part 50 on the other hand protect the moisture sensitive layers from the ingress of moisture from the environment. In an alternative embodiment both barrier structures may be present in the first part 10. For example the barrier structure may be present between the cathode layer 24 and the adhesive layer 28.

The manufacturing of the electronic device as illustrated in FIG. 1 may now be completed by lamination of the semi-finished product obtained in FIG. 4E with the cover 50, comprising a substrate 52 and the at least one electrically conductive structure 66 in the first plane 61 shown in FIG. 3. Therewith the first and a second mutually insulated conductive structure 66, 68 of the first plane 61 are brought into contact with the electrical conductive material 32, 34 at openings of the first holes and second holes in the adhesive layer 28 respectively. Prior to this step, a release liner 36, if present, may be removed. In this manufacturing process, the release liner 36 serves a double function. On the one hand it catches debris that is released during the process of forming the holes 38, 40, the ring-shaped recesses 33 and the slits to be filled with the barrier material 30 in the perimeter of the device. On the other hand the release liner 36 facilitates a rapid lamination. Once the release liner 36 is removed, the adhesive layer 28 becomes available with which the functional stack 10 and the cover can be laminated together. In case of an unexpected request for a particular product, that particular product can be manufactured by laminating the relevant functional stack 10 with a cover 50. No delay is incurred by application of an adhesive layer.

Figure 5:
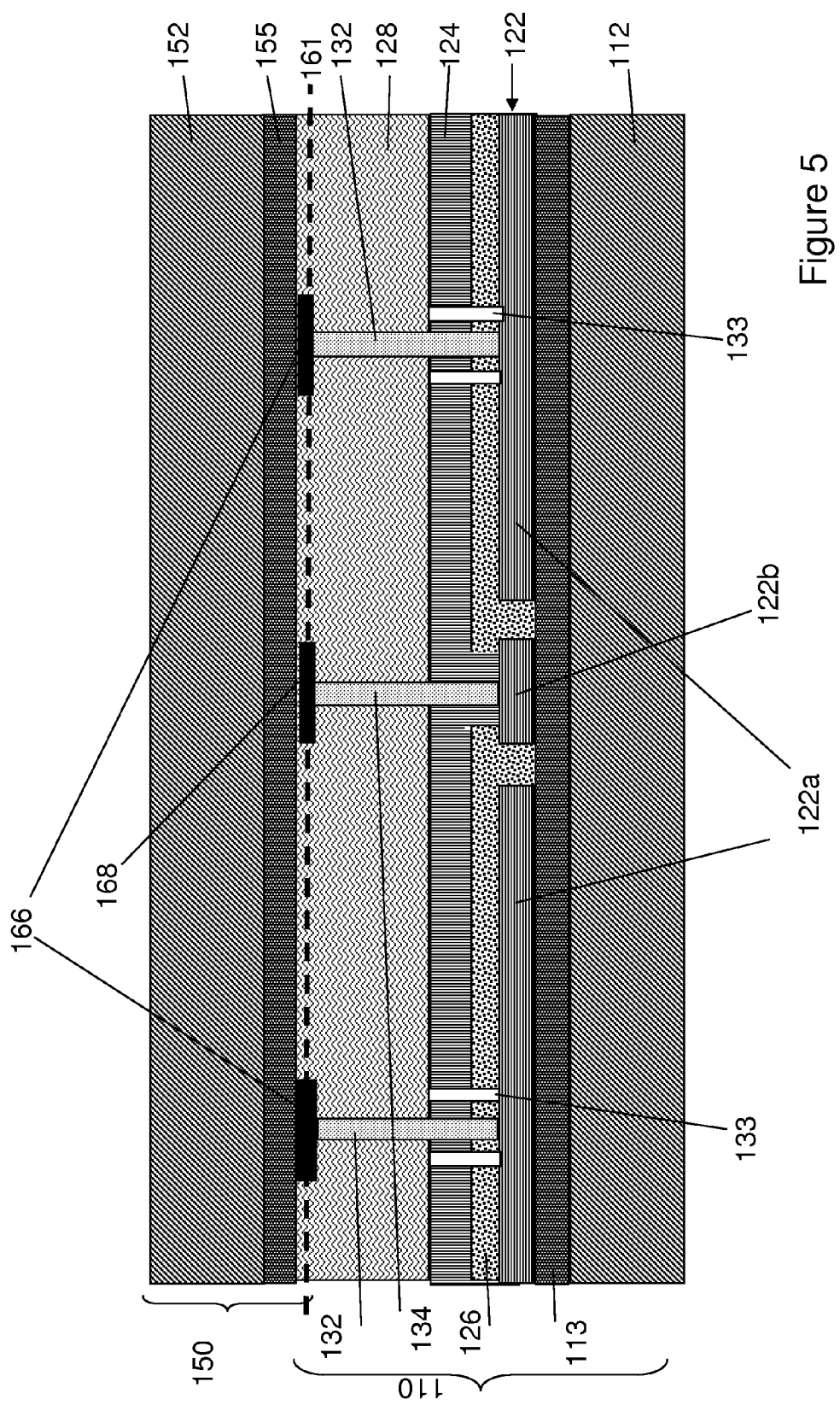
FIG. 5 shows a second embodiment of an electronic device according to the invention.

FIG. 5 shows an alternative embodiment of an electronic device according to the invention. Parts therein corresponding to those in FIG. 1 have a reference number that is 100 higher. In FIG. 5 reference numerals 113 and 155 denotes a barrier structure comprising a stack of alternating organic and inorganic layers, for example a stack 14, 16, 18, 20 as described with reference to FIG. 1.

In the alternative embodiment of the electronic device shown in FIG. 5 the first electrically conductive layer 122 has a first and a second segment 122a, 122b. The segments 122a, 122b are mutually electrically insulated and are arranged in a second, common plane. The first segment 122a of the first electrically conductive layer 122 is electrically connected to the first conductive structure 166. The second electrically conductive layer 124 is electrically interconnected to the second conductive structure 168 via the second electrical conductor 134 and the second segment 122b of the first electrically conductive layer 122.

FIG. 6A-6E illustrate a method of manufacturing the alternative embodiment shown in FIG. 5. In a first step of the method, shown in FIG. 6A, a patterned layer 122 of a transparent, electrically conductive material is applied. The layer comprises at least one first segment 122a and one second segment 122b that are mutually insulated. The pattern in the layer may be applied directly, for example by a printing process, or first a continuous layer may be applied that is patterned afterwards.

As shown in FIG. 6B a stack 126 of one or more active layers, e.g. comprising one or more of a luminescent layer, a hole transport layer or an electron transport layer, is applied at the patterned layer 122.

In a following step, as shown in FIG. 6C the stack 126 is removed from the second segment 122b (or a portion thereof). Alternatively the stack 126 may be directly applied in a patterned form, for example by a printing process.

In a next step illustrated in FIG. 6D at least one layer 124 of an electrically conductive material are applied. The at least one layer 124 forms an electric contact with the at least one segment 122b of the first electrically conductive layer 122. As shown in FIG. 6E and in FIG. 6F according to view F in FIG. 6E, holes 137 are formed in the second electrically conductive layer 124 extending via the stack 126 to the first electrically conductive layer 122. The holes 137 have a circular shaped inner portion 137a and a ring-shaped outer-portion 137b separate from the inner portion.

Figure 6G:
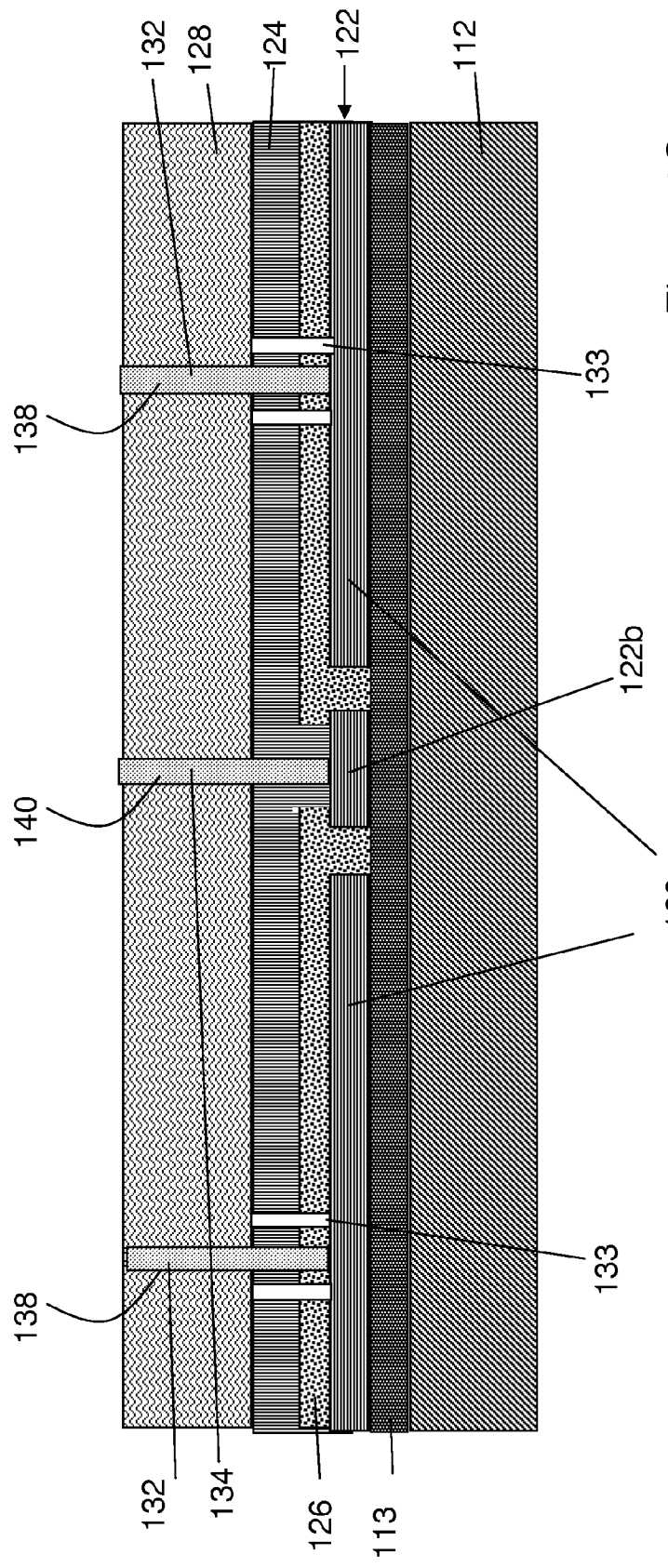

In a next step illustrated by FIG. 6G, an adhesive layer 128 is applied at the at least one electrically conductive layer 124. The adhesive layer 128 and possibly a release layer are provided with first holes 138 that are in line with the circular shaped inner portion 137a of the holes 137. One or more second holes 140 are applied that extend to a second segment of the first electrically conductive layer 122. The adhesive material may fill the ring shaped outer portion 137b of the holes 137. Alternatively the outer portion may be left free of material, or may be filled with a separate insulating material.

In a next step conductors 132, 134 are applied in the holes 138, 140 respectively. The first transverse conductors 138 extend through the inner portion 137a of the holes to the first electrically conductive layer 122. In an embodiment the holes 137 are filled with an insulating material that is cured if necessary, and subsequently smaller holes 137a are drilled inside the volume of insulating material, which smaller holes are subsequently filled with an electrically conductive material that forms the transverse conductors.

Subsequently the resulting semi-finished product shown in FIG. 6G may be laminated with a cover, e.g. a cover 50 as shown in FIG. 3.

In this embodiment the insulating zone around the first transverse electrical conductors 132 is applied at a distance. Alternatively the insulating zones may directly border to the first transverse electrical conductors 132, as was shown in the embodiment of FIG. 1. Likewise in the embodiment of FIG. 1, where the second transverse electrical conductors 34 are directly connected to the second electrically conductive layer 24, the insulating zones around the first transverse electrical conductors may be applied at a distance as a ring shaped zone separate from the hole that comprises the first transverse electrical conductor 32.

Figure 7:
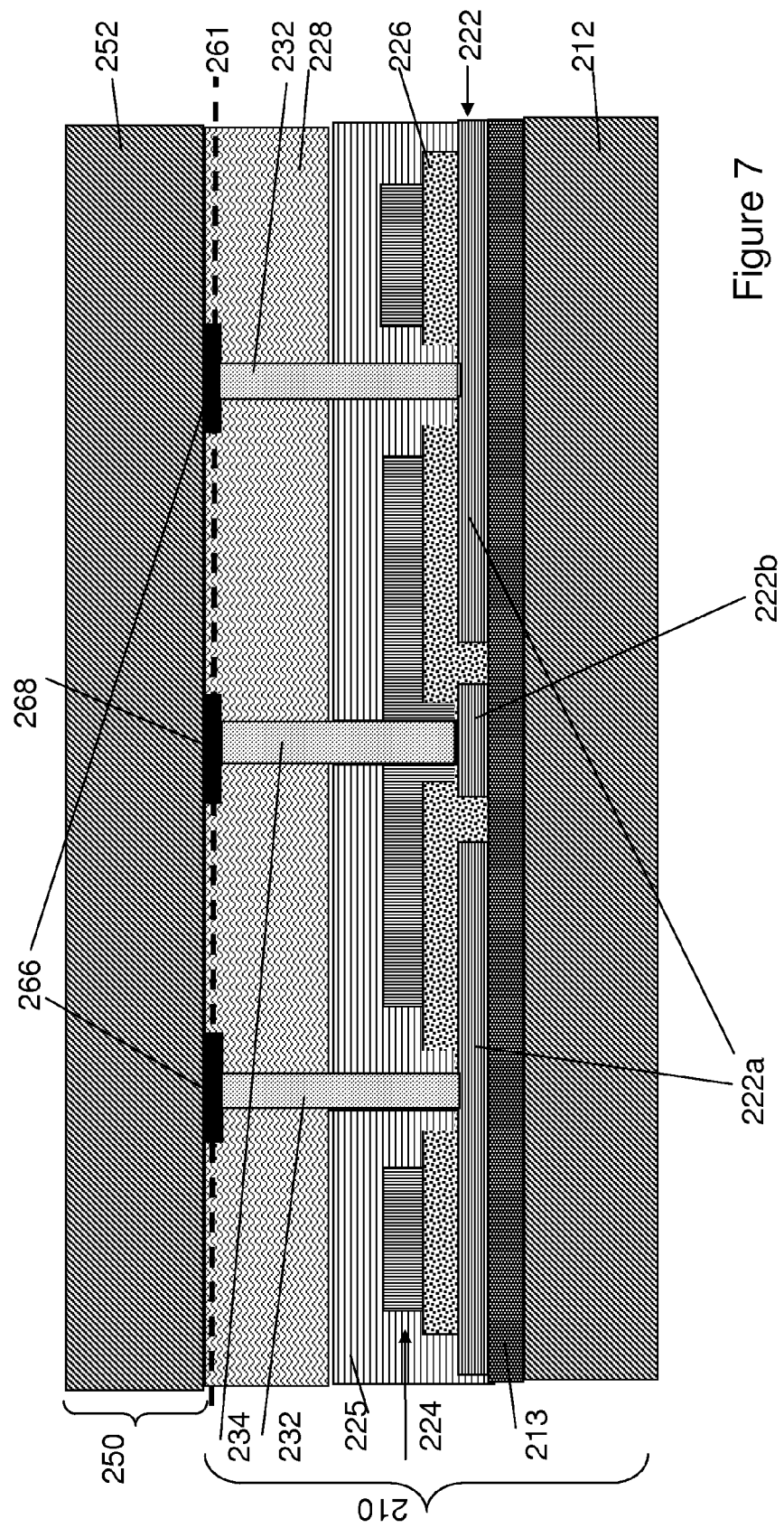
FIG. 7 shows a third embodiment of an electronic device according to the invention.

FIG. 7 shows a further alternative embodiment. Parts therein corresponding to those in FIG. 1 have a reference number that is 200 higher. Parts therein corresponding to FIG. 5 have a reference number that is 100 higher.

In the embodiment of FIG. 7 the functional structure 226 and the second electrically conductive layer 224 are provided with spaces that are in line with the first transverse electrical conductors 232. The spaces of the functional structure 236 are smaller than and lie within the spaces of the second electrically conductive layer 224.

The electronic device shown in FIG. 7 comprises a thin film structure 225 between the second electrically conductive layer 224, and the adhesive layer 228, the thin film structure 225 comprising alternating organic and inorganic layers. Suitable materials for use in the organic and inorganic layers are described in the earlier filed application EP08156493.2. The presence of this thin film structure has the advantage that the semi-finished product without the release lines has a longer lifetime and that it is not necessary that a barrier structure is present in the cover. FIG. 7 shows that the thin film structure 225 fills the spaces formed in the functional structure 226 and in the second electrically conductive layer 224.

Figure 8E:
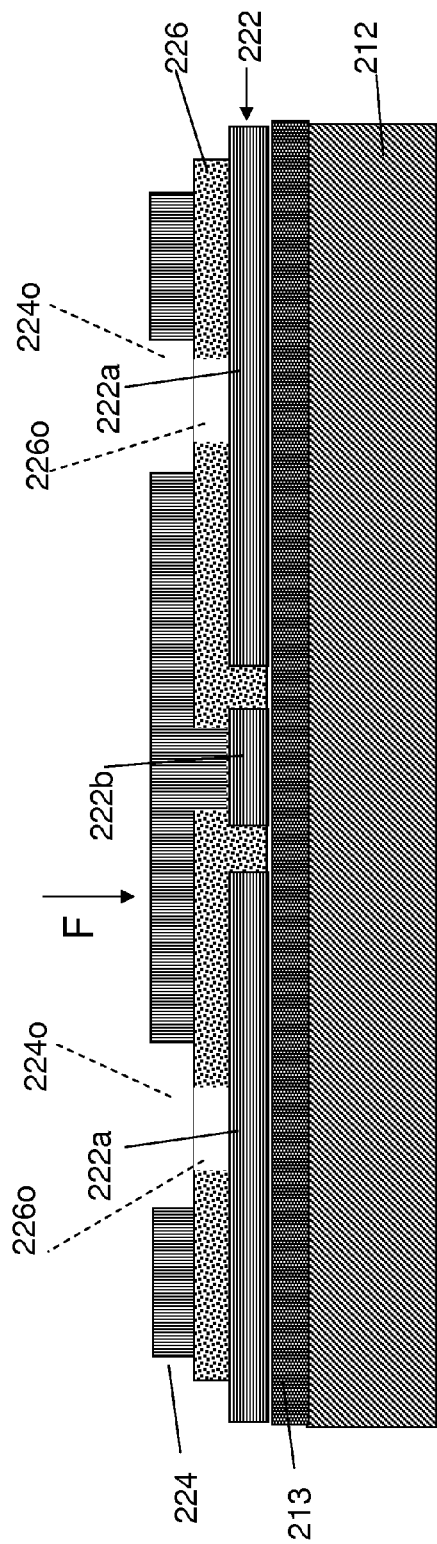

A method of manufacturing the electronic device shown in FIG. 7 is now illustrated with reference to FIG. 8A-8H. Therein FIGS. 8A and 8B shows a first stage in the manufacturing process, wherein a patterned first transparent electrically conductive layer 222 is applied onto the barrier structure 213 at the substrate 212. As in the embodiment shown in FIG. 5, the patterned first transparent electrically conductive layer 222 has a first and a second segment 222a, 222b that are mutually electrically insulated and that are arranged in a second, common plane. FIG. 8B shows a top-view of FIG. 8A according to arrow B. By way of example three segments are shown, however, any other plurality of segments is also applicable.

FIGS. 8C and 8D shows a further stage in the manufacturing process, wherein a functional structure 226 is applied that is subsequently patterned to provide spaces 226o therein. Alternatively, the functional structure 226 may be applied in its patterned form in single step by patterned deposition.

Figure 8F:
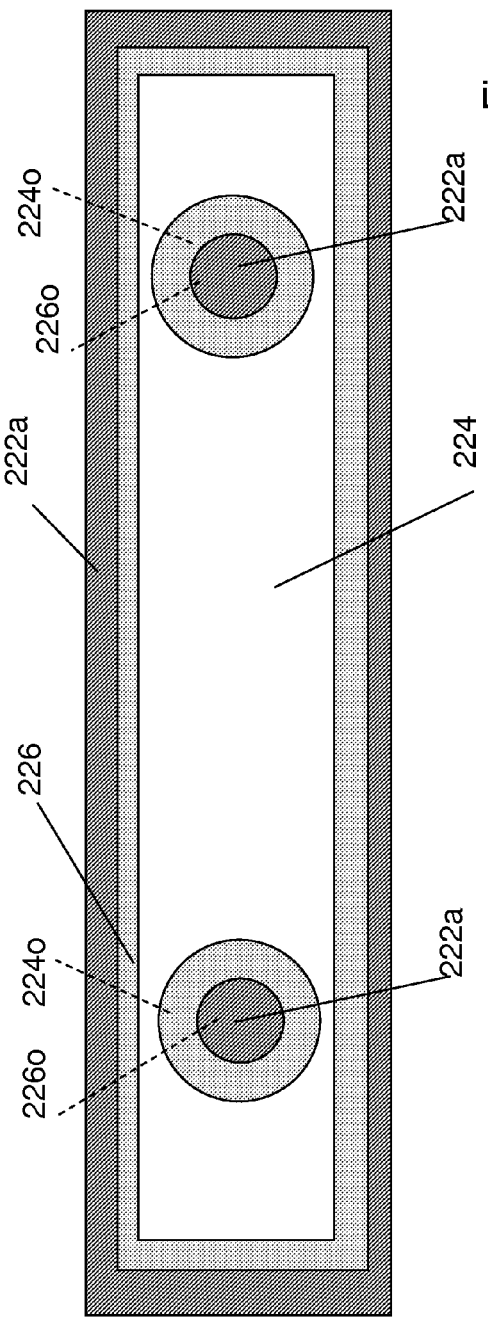

In the stage shown in FIGS. 8E and 8F a second electrically conductive layer 224 is provided with spaces 224o in line with the spaces 226o in the functional structure. The spaces 226o of the functional structure 226 are smaller than and lie within the spaces 224o of the second electrically conductive layer 224. FIG. 8F shows a top-view according to F in FIG. 8E.

In a next stage, shown in FIG. 8G, a thin film structure 225 is applied comprising alternating organic and inorganic layers. The thin film structure 225 fills the spaces formed in the functional structure 226 and in the second electrically conductive layer 224. Holes 238 and 240 are applied in the thin film structure 225 as shown in FIG. 8H. These holes are in line with the spaces 226o of the functional structure 226 and the spaces 224o of the second electrically conductive layer 224. Subsequently the semi-finished product of FIG. 8H may be completed into an end product analogously as described for the product shown in FIG. 5.

Figure 9:
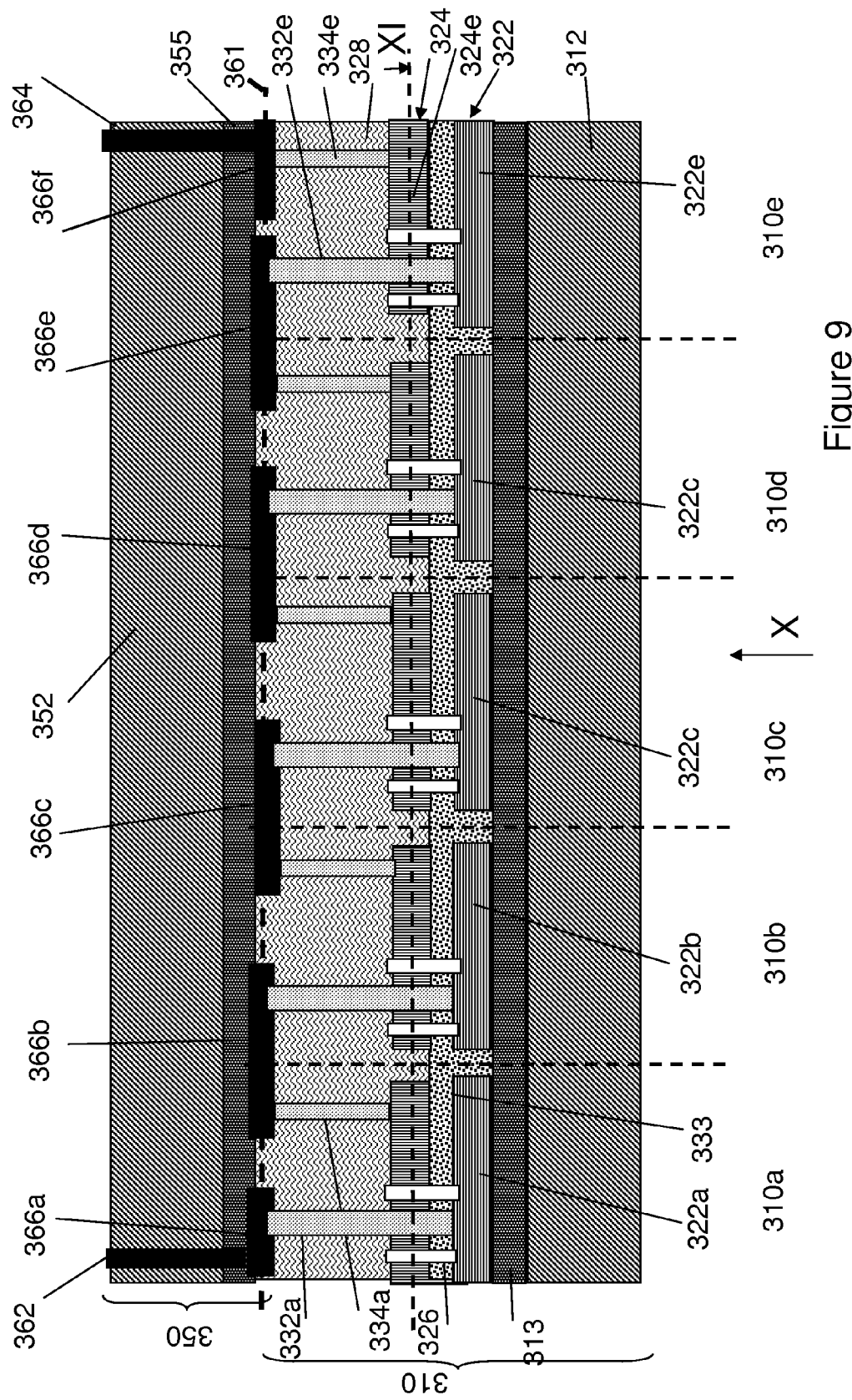
FIG. 9 shows a fourth embodiment of an electronic device according to the invention.

FIGS. 9, 10 and 11 show a still further embodiment. Parts therein corresponding to FIG. 1 have a reference number that is 300 higher. FIG. 10 shows a bottom view of the cover 350 according to X in FIG. 9. FIG. 11 shows a cross-section of the functional stack 310 according to XI in FIG. 9. In this embodiment, the first and the second electrically conductive layer 322 and 324 are segmented. Therein segments 322a, ..., 322e of the first electrically conductive layer are arranged opposite to respective segments 324a, ..., 324e of the second electrically conductive layer 324. Each pairs of opposing segments 322a, 324a; 322b, 324b etc. corresponds to a functional stack segment 310a, ..., 310e. The functional stack segments 310a, ..., 310e are serially arranged, in that each segment 322b (apart from the first one 322a) of the first electrically conductive layer 322 is electrically connected to a segment 324a of the second electrically conductive layer 324 of a subsequent functional stack segment 310a. The electrical connection between a segment 322b of the first electrically conductive layer 322 and a segment 324a of the second electrically conductive layer 324 of the subsequent functional stack segment 310a is formed by a first transverse electrical conductor 332b, a conductive structure 366b at the cover 350 and a second transverse electrical conductor 334a. The first segment 322a of the first electrically conductive layer 322 is electrically connected to a first terminal 362 via the first electrically conductive structure 366a at the cover 350. The last segment 324e of the second electrically conductive layer 324 is electrically connected to a second terminal 364 via a sixth electrically conductive structure 366f at the cover 350.

Also in this embodiment a high homogeneity of light output can be obtained, while the first electrically conductive layer can be relatively thin and therewith have a good transparency. This embodiment allows for high voltage driving with a low current.

Figure 12:
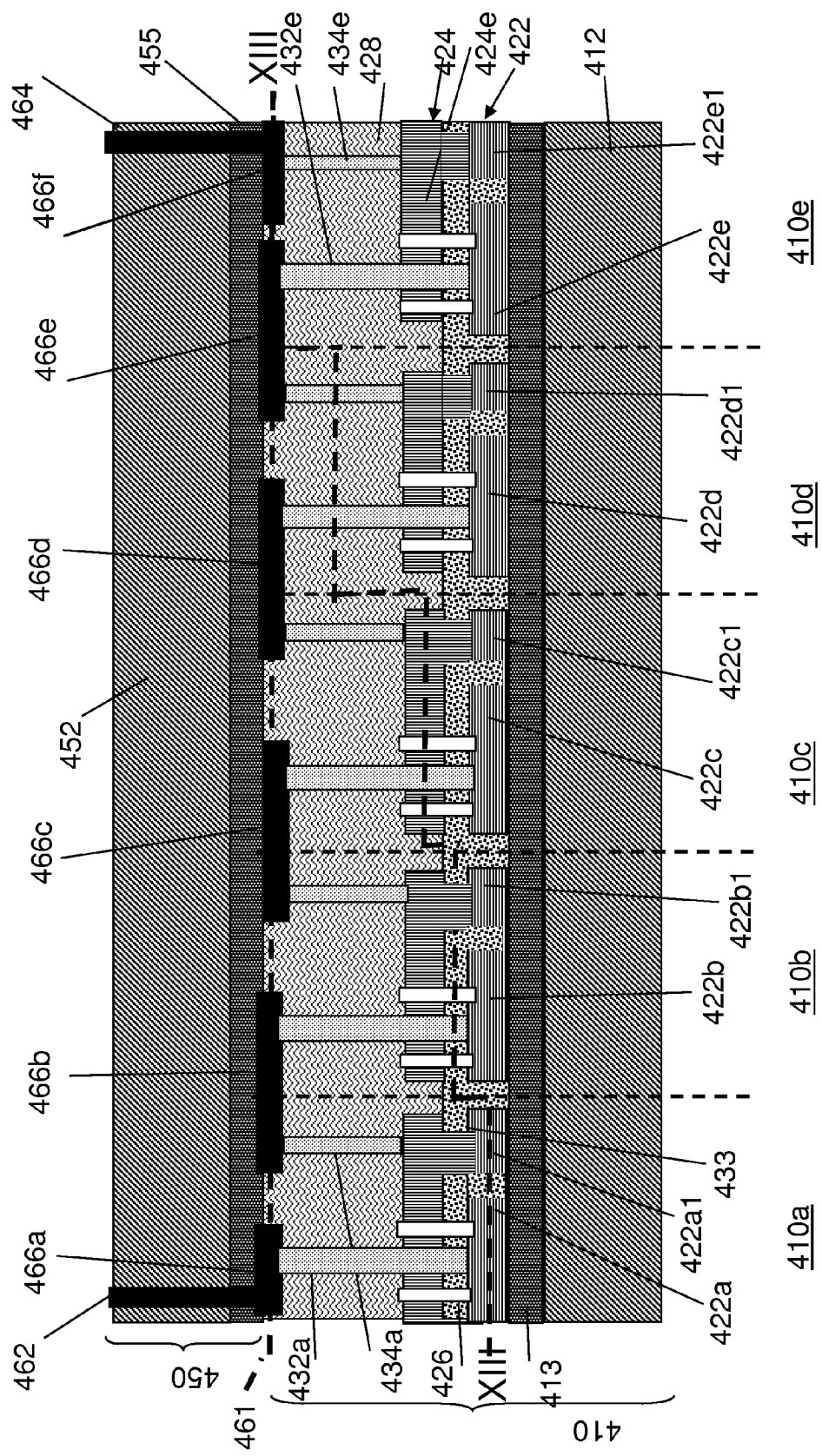
FIG. 12 shows a fourth embodiment of an electronic device according to the invention.
Figure 13:
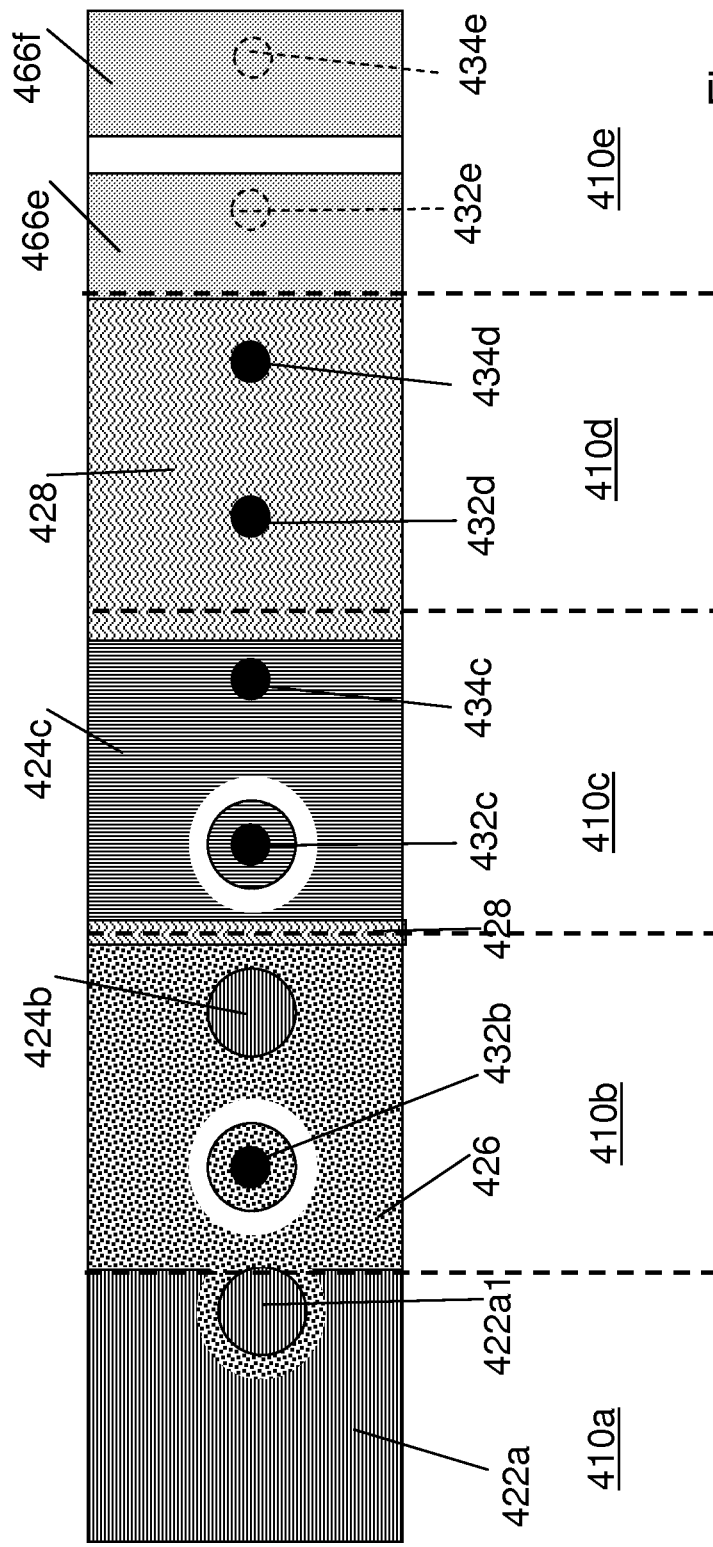
FIG. 13 shows a stepped cross-section according to XIII-XIII in FIG. 12.

FIGS. 12 and 13 show another example of a serially connected device. Parts therein having a reference number corresponding to those of FIG. 1 have a reference number that is 400 higher. FIG. 13 shows a stepped cross-section through the device of FIG. 12 according to line XIII-XIII.

In the example of the serially connected device according to FIGS. 12 and 13, each segment 422a, ..., 422e of the first conductive layer has an island 422a1, ..., 422e1 that is connected to a corresponding segment 424a, ..., 424e in the second conductive layer 424. This embodiment allows a large tolerance when drilling holes towards the second electrically conductive layer 434. It is sufficient if these holes extend to the second electrically conductive layer 434, but if due to tolerances in a drilling process the holes extend further into the stack, for example up to the first electrically conductive layer 422, this is not a problem, as the segments 424a, ..., 424e of the second electrically conductive layer 424 are still connected with the islands 422a1, ..., 422e1 of the first conductive layer. Accordingly the second transverse electrical conductors 434c, 434d, 434e may extend to the second electrically conductive layer 424, as shown in FIGS. 12 and 13, but they may alternatively extend further into the stack, for example towards the first electrically conductive layer 422, analogously as is shown in FIG. 5. In this embodiment of the serially connected variant, it is allowed that the second conductive layer 424 is relatively thin and therewith has a good transparency.

Figure 14:
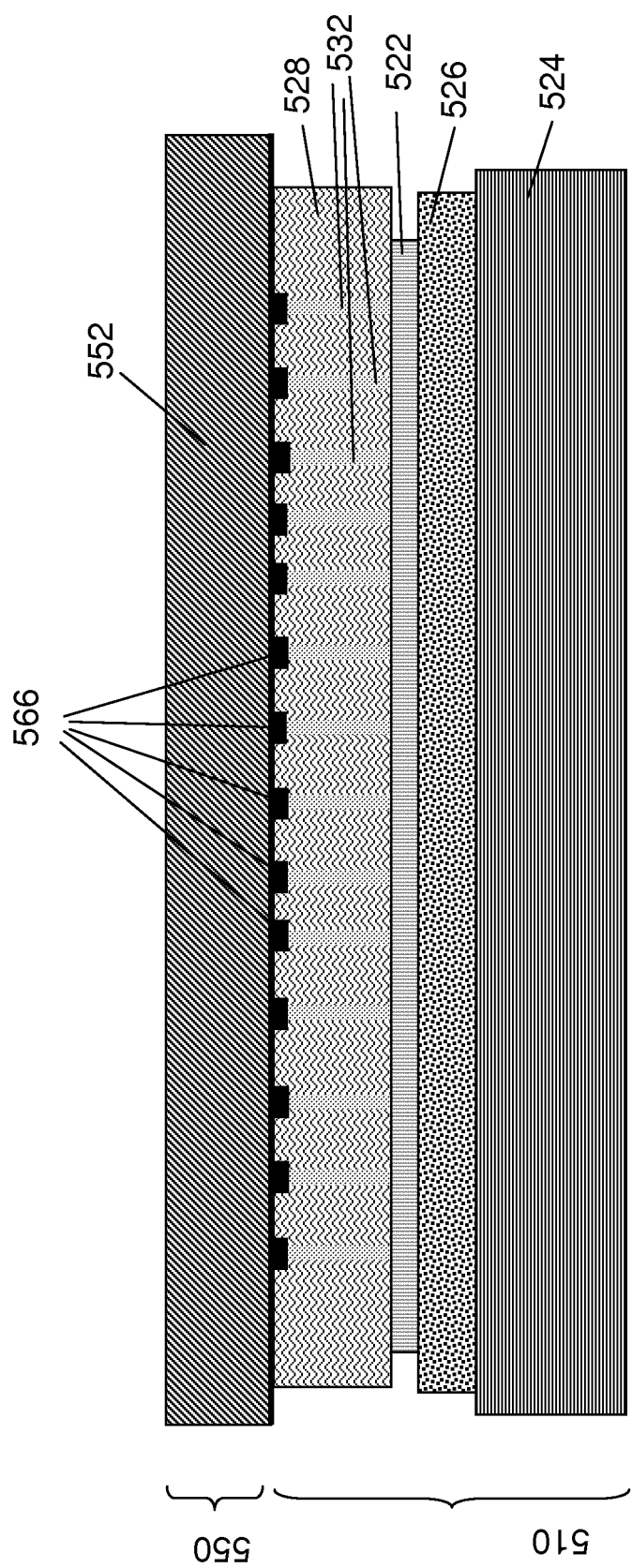
FIG. 14 shows a fifth embodiment of an electronic device according to the invention.

FIG. 14 shows a further embodiment of an electronic device according to the present invention. Parts therein corresponding to FIG. 1 have a reference number that is 500 higher. This device comprises an optically functional structure 526 for example a layer, or a stack of layers of an organic material as mentioned above for the previous embodiments. Alternatively the optically functional structure may comprise one or more layers of an inorganic material, which is applied at a relatively thick metal substrate 524. The latter serves as the second electrically conductive layer. The first electrically conductive layer 522 for example of a transparent metal or a transparent metal oxide such as ITO, is applied at the opposite side of the optically functional layer 526. The first electrically conductive layer 522 for example has a thickness in a range of 10 to 100 nm. The device shown in FIG. 14 is a top-emitting LED. The (visible) radiation generated in the functional structure formed by the optically functional layer 526 is transmitted via the first transparent electrically conductive layer 522, via the adhesive layer 528 and via the cover 550 with the electrically conductive structure 566 at the substrate 552. To that end, the electrically conductive structure is applied as a grid having lines with a width in a range of 10 to 100 μm, wherein the lines of the grid cover not more than 10% of the surface of the cover. If the width is much smaller than 10 μm, for example 5 μm it becomes difficult to provide sufficient power to the electronic device, in particular for high-power LEDs. If the width is much larger than 100 μm, for example 200 μm then the structures become visible, which is a disadvantage for decorative products.

The thickness of the lines is for example in the range of 10 to 50 μm, for example 25 μm. Alternatively the device shown in FIG. 14 may be an (organic) photo-voltaic cell. The optically functional structure 526 may be of an inorganic nature, for example comprise a single inorganic layer, e.g. a silicon layer, but may alternatively comprise a stack of layers, such as a CIS-stack (copper, indium, selenium). In case of an organic photovoltaic device, the functional structure 526 may be arranged as in a dye sensitized OPV cell or comprise a polymer or small molecule OPV stack for example.

By way of example a method of manufacturing the device of FIG. 14 is shown in FIGS. 15A to 15D.

Figure 15A:
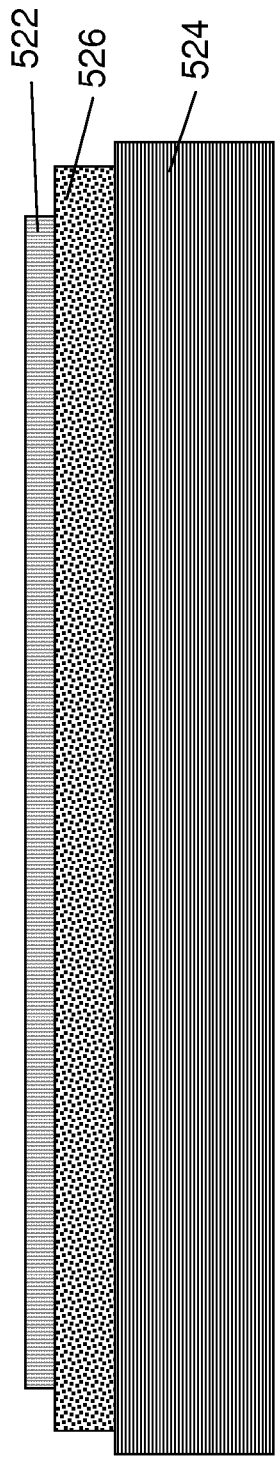

FIG. 15A shows a first manufacturing stage, wherein the optically functional layer 526 are applied at the metal substrate 524, as well as the first transparent, electrically conductive layer that is applied at the optically functional layer 526.

Figure 15B:
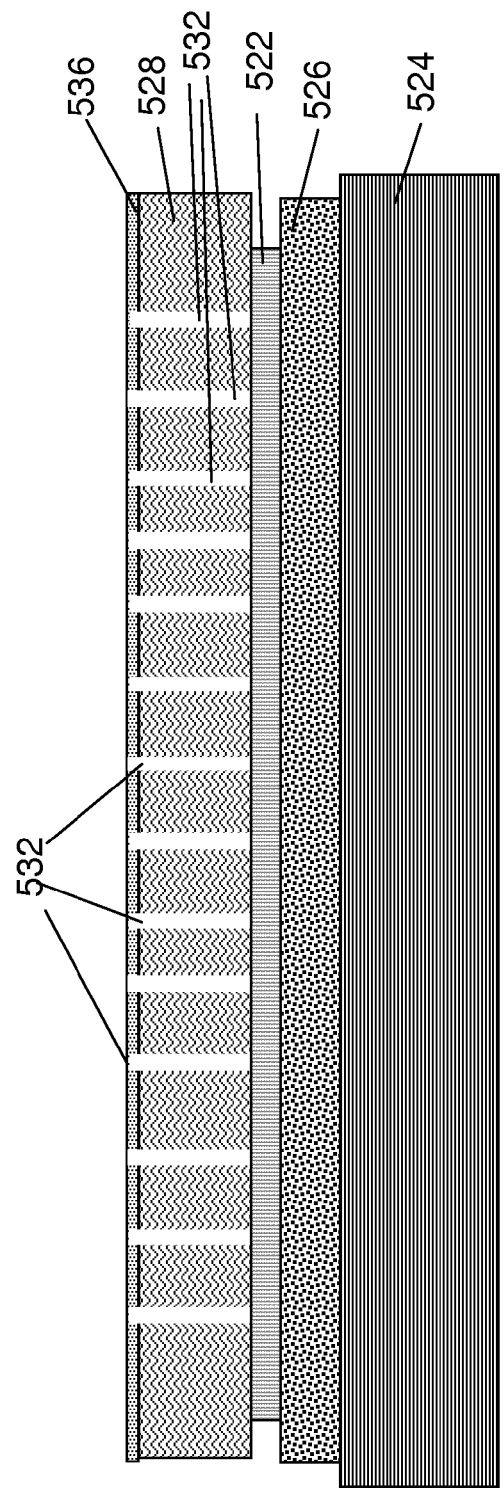

FIG. 15B shows a second manufacturing stage, wherein an adhesive foil, 528, provided with a release liner 536 is applied at the first electrically conductive layer. The release liner is for example a polymer foil, e.g. a PET-foil or a PEN-foil having a thickness in the range of about 5 μm to about 100 μm, for example 12.5 μm. The release liner functions as a backbone for the electrically insulating adhesive layer. Contrary to the methods shown for the previous embodiments the adhesive foil 528 with the release liner is 536 is already prepared with holes 533. Alternatively the holes 533 may be applied after the adhesive foil 528 is adhered to the layer 522, but by providing the holes 533 in advance it is ascertained that the holes extend exactly until the first electrically conductive layer 522. This method, wherein the adhesive foil is provided with holes before it is applied to the remainder of the functional stack, is also useful for the manufacturing of the other embodiments, for example the devices shown in FIGS. 1, 5, 7, 9 and 12.

In the next step shown in FIG. 15C the holes 533 are filled with an electrically conductive material 532. Subsequently the release liner is removed (FIG. 15D).

Finally the cover 550 having the electrically conductive structure 566 at the substrate 552 is adhered to the surface of the insulating adhesive layer 528 of the functional stack 510 so that the product of FIG. 14 is obtained.

Figure 16:
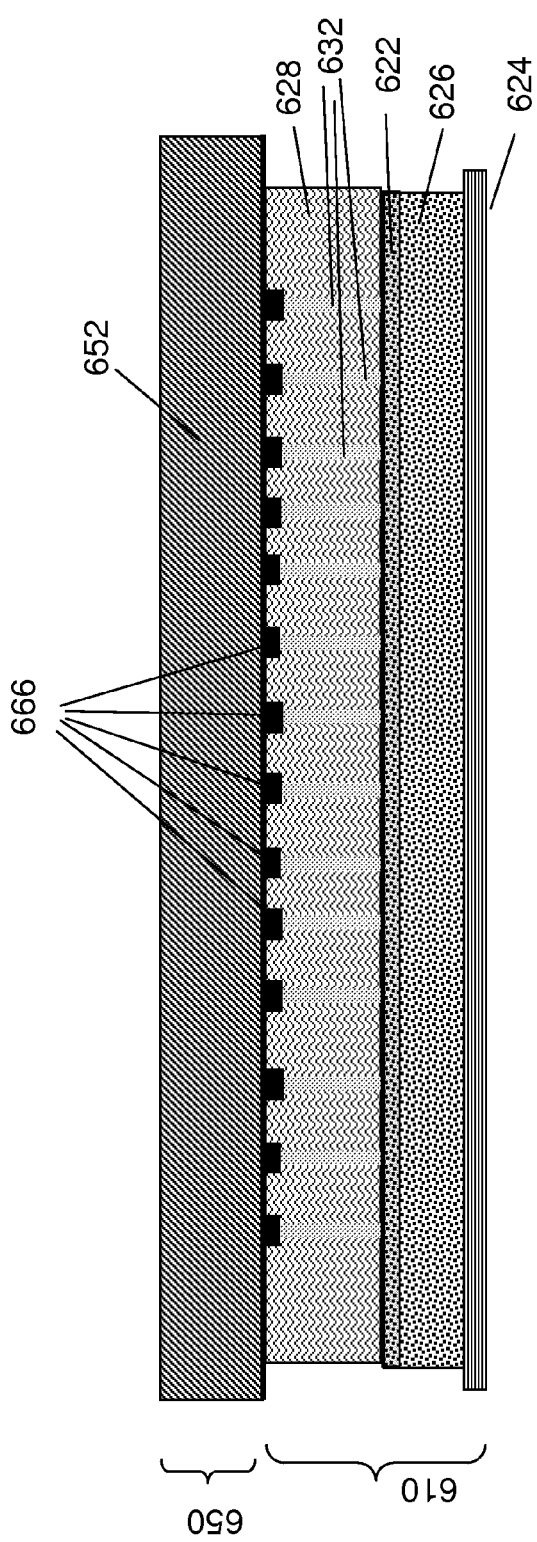
FIG. 16 shows a sixth embodiment of an electronic device according to the invention.

FIG. 16 shows a further embodiment. Parts therein corresponding to those in FIG. 1 have a reference number that is 600 higher. In the embodiment of FIG. 16, the optically functional layer 626 is a photo voltaic cell and a doped region thereof functions as the first, transparent, electrically conductive layer 622. The second electrically conductive layer 624 is formed by a metal foil that is arranged as a back contact to the optically functional layer 626.

The electronic device of FIG. 16 can be manufactured in a way analogous to the method as shown in FIGS. 15A-D for the device of FIG. 14.

According to said method the optically functional layer 626 provided with the doped region 622 is applied at the metal foil 624. Subsequently, as illustrated in FIG. 15B for the product of FIG. 14, the adhesive layer 628 with release liner (not shown) is applied at the surface of the doped region 622 of the optically functional layer 626. Analogous to the step shown in FIG. 15C, an electrically conductive material is applied in the holes of the adhesive layer 628 to form the transverse conductors 632. Analogously to the step shown in FIG. 15D, the release liner is removed, and subsequently the cover 650 with the electrically conductive structure is applied to obtain the product of FIG. 16.

The various parts used to manufacture an electronic device according to the invention may be manufactured in an arbitrary order or manufactured at the same time. For example in the embodiment of FIG. 1 these part are the functional stack 10 and the cover 50. In the embodiment of FIG. 16 these parts are the metal foil 624 with the optically functional layer 626, the adhesive layer 628 with the release liner, and the cover 650.

Additional layers, e.g. planarization layers, filter layers, protection layers may be present between the layers that are explicitly described herein.

Figure 17:
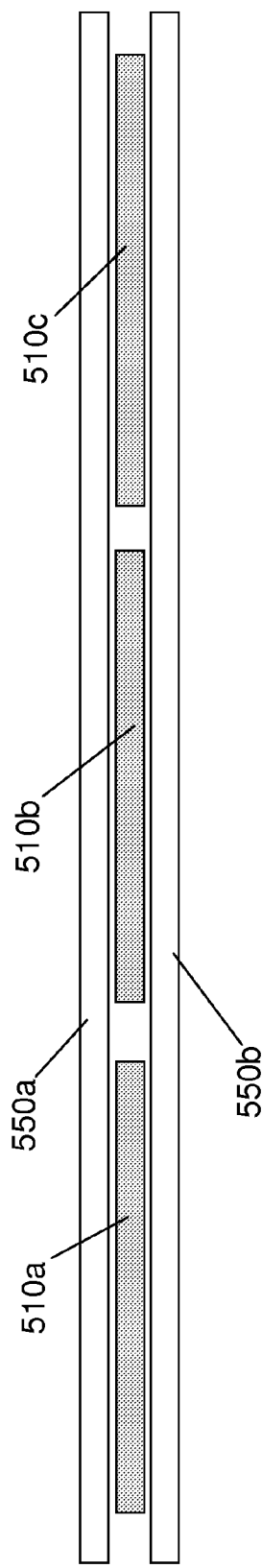
FIG. 17 shows plurality of electronic devices according to the invention that are integrated into a common package.

As shown schematically in FIG. 17 a plurality of functional stacks 510 may be laminated at a common cover 550a or laminated between a common pair of covers 550a, 550b. This is analogously applicable to other electronic devices according to the invention. For example a plurality of functional stacks 610 may be laminated in this way.

In the claims the word "comprising" does not exclude other elements or steps, and the indefinite article "a" or "an" does not exclude a plurality. A single component or other unit may fulfil the functions of several items recited in the claims. The mere fact that certain measures are recited in mutually different claims does not indicate that a combination of these measures cannot be used to advantage. Any reference signs in the claims should not be construed as limiting the scope.

The invention claimed is:

1. An electronic device, comprising a functional stack (10; 110; 210; 310; 410; 510; 610) and a cover (50; 150; 250; 350; 450; 550; 650) coupled thereto by an insulating adhesive layer (28; 128; 228; 328; 428; 528; 628), the functional stack comprising a first transparent and electrically conductive layer (22; 122; 222; 322; 422; 522; 622), a second electrically conductive layer (24; 124; 224; 324; 424; 524; 624) and a functional structure (26; 126; 226; 326; 426; 526; 626), comprising at least one optically functional layer, sandwiched between said first and second conductive layer, the cover (50; 150; 250; 350; 450; 550; 650) including a substrate (52; 152; 252; 352; 452; 552; 652) provided with at least a first electrically conductive structure (66; 166; 266; 366a; 466a; 566; 666) arranged in a first plane between the adhesive layer (28; 128; 228; 328; 428; 528; 628) and the substrate (52; 152; 252; 352; 452; 552; 652), and wherein first transverse electrical conductors (32; 132; 232; 332; 432; 532; 632) transverse to the first plane (61; 161; 261; 361; 461; 561; 661) electrically interconnect one of the first and the second electrically conductive layer (22; 122; 222; 322; 422; 522; 622) with the first conductive structure (66; 166; 266; 366a; 466a; 566; 666, wherein the second electrically conductive layer (124) is provided with holes (137) having an inner portion (137a) and a ring-shaped outer-portion (137b) separate from the inner portion and wherein the first transverse conductors (138) extend through the inner portion (137a).

2. An electronic device according to claim 1, wherein the outer portion (137b) is filled with an insulating material.

3. An electronic device, comprising a functional stack (10; 110; 210; 310; 410; 510; 610) and a cover (50; 150; 250; 350; 450; 550; 650) coupled thereto by an insulating adhesive layer (28; 128; 228; 328; 428; 528; 628), the functional stack comprising a first transparent and electrically conductive layer (22; 122; 222; 322; 422; 522; 622), a second electrically conductive layer (24; 124; 224; 324; 424; 524; 624) and a functional structure (26; 126; 226; 326; 426; 526; 626), comprising at least one optically functional layer, sandwiched between said first and second conductive layer, the cover (50; 150; 250; 350; 450; 550; 650) including a substrate (52; 152; 252; 352; 452; 552; 652) provided with at least a first electrically conductive structure (66; 166; 266; 366a; 466a; 566; 666) arranged in a first plane between the adhesive layer (28; 128; 228; 328; 428; 528; 628) and the substrate (52; 152; 252; 352; 452; 552; 652), and wherein first transverse electrical conductors (32; 132; 232; 332; 432; 532; 632) transverse to the first plane (61; 161; 261; 361; 461; 561; 661) electrically interconnect one of the first and the second electrically conductive layer (22; 122; 222; 322; 422; 522; 622) with the first conductive structure (66; 166; 266; 366a; 466a; 566; 666, wherein the functional structure (226) and the second electrically conductive layer (224) are provided with spaces that are in line with the first transverse electrical conductors (232), and wherein the spaces of the functional structure (226) are smaller than and lie within the spaces of the second electrically conductive layer (224), the device further comprising a thin film structure (225) between the second electrically conductive layer (224), and the adhesive layer (228), the thin film structure (225) comprising alternating organic and inorganic layers, wherein the thin film structure (225) fills the spaces formed in the functional structure (226) and in the second electrically conductive layer (224).

4. An electronic device according to claim 3, wherein the functional stack (310) is partitioned into functional stack segments (310a, . . . , 310e), each functional stack segment (310a, . . . , 310e) comprising a segment (322a, . . . , 322e) of the first electrically conductive layer (322) and a segment (324a, . . . , 324e) of the second electrically conductive layer (324), the functional stack segments (310a, . . . , 310e) being serially arranged, in that at least one segment (322b) of the first electrically conductive layer (322) is electrically connected to a segment (324a) of the second electrically conductive layer (324) via a conductive structure (366b) at the cover (350).

5. A method of manufacturing an electronic device, comprising the steps of:
   a) providing a first transparent electrically conductive layer,
   b) providing a functional structure comprising one or more functional layers,
   c) providing a second electrically conductive layer,
   d) providing an electrically insulating adhesive layer,
   e) providing a release liner at a free surface of the insulating adhesive layer,
   f) forming holes through the insulating adhesive layer and the release liner,
   g) applying an electrical conductive material in the holes, which material extends to at least one of the first electrically conductive layer and the second electrically conductive layer,
   h) removing the release liner, and
   i) after removing the release liner, applying a cover comprising a substrate provided with at least a first conductive structure that are brought into contact with the electrical conductive material at openings of the holes in the adhesive layer.

* * * * *